US012646577B2

(12) United States Patent
Yang et al.

(10) Patent No.: US 12,646,577 B2
(45) Date of Patent: Jun. 2, 2026

(54) OPERATION METHOD OF MEMORY DEVICE USING PASS VOLTAGES

(71) Applicant: Samsung Electronics Co., Ltd., Suwon-si (KR)

(72) Inventors: Miju Yang, Suwon-si (KR); Jun-Ho Seo, Suwon-si (KR); Seongyong Kim, Suwon-si (KR); Hyeyoung Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 18/450,053

(22) Filed: Aug. 15, 2023

(65) Prior Publication Data

US 2024/0079069 A1    Mar. 7, 2024

(30) Foreign Application Priority Data

Aug. 23, 2022    (KR) ........................ 10-2022-0105796
Oct. 27, 2022    (KR) ........................ 10-2022-0140656

(51) Int. Cl.

| | |
|---|---|
| *G11C 16/06* | (2006.01) |
| *G11C 16/08* | (2006.01) |
| *G11C 16/10* | (2006.01) |
| *G11C 16/34* | (2006.01) |

(52) U.S. Cl.
CPC .......... *G11C 16/3459* (2013.01); *G11C 16/08* (2013.01); *G11C 16/102* (2013.01)

(58) Field of Classification Search
CPC ... G11C 16/3459; G11C 16/08; G11C 16/102; G11C 11/5628; G11C 16/32; G11C 16/0483; G11C 16/10; G11C 16/20; G11C 16/3427

USPC ...................................................... 365/185.22
See application file for complete search history.

(56) References Cited

U.S. PATENT DOCUMENTS

| | | | |
|---|---|---|---|
| 6,614,688 B2 * | 9/2003 | Jeong ...................... | G11C 16/10 |
| | | | 365/185.27 |
| 8,023,321 B2 * | 9/2011 | Kim ................... | G11C 16/3418 |
| | | | 365/185.28 |
| 8,274,831 B2 * | 9/2012 | Mokhlesi ........... | G11C 16/0483 |
| | | | 365/185.28 |
| 8,385,131 B2 | 2/2013 | Seol | |

(Continued)

FOREIGN PATENT DOCUMENTS

KR    10-2011-0002243 A    1/2011

*Primary Examiner* — Tha-O H Bui
(74) *Attorney, Agent, or Firm* — Harness, Dickey & Pierce, P.L.C.

(57) ABSTRACT

An operation method of a memory device includes a plurality of memory cells stacked in a direction perpendicular to a substrate and a plurality of word lines respectively connected with the plurality of memory cells. The method includes applying a 0-th pass voltage to a first selected word line among the plurality of word lines and applying a first pass voltage to a first upper adjacent word line among the plurality of word lines, during a first word line setup period, and applying a first program voltage to the first selected word line and applying a second pass voltage smaller than the first pass voltage to the first upper adjacent word line, during a first program execution period after the first word line setup period. The first upper adjacent word line is a word line physically adjacent to the first selected word line.

19 Claims, 22 Drawing Sheets

(56)                    References Cited

U.S. PATENT DOCUMENTS

| | | | |
|---|---|---|---|
| 8,537,617 B2 * | 9/2013 | Kim | G11C 16/08 |
| | | | 365/185.12 |
| 9,053,796 B2 | 6/2015 | Shim | |
| 9,378,826 B2 | 6/2016 | Lee | |
| 10,388,381 B2 | 8/2019 | Shin et al. | |
| 10,410,728 B2 | 9/2019 | Shim | |
| 10,541,033 B2 | 1/2020 | Jung et al. | |
| 10,643,695 B1 * | 5/2020 | Nguyen | G11C 11/5628 |
| 10,892,023 B2 | 1/2021 | Wang et al. | |
| 11,189,346 B2 | 11/2021 | Lee | |
| 11,355,195 B2 | 6/2022 | Shim et al. | |
| 2015/0294726 A1 | 10/2015 | Sim et al. | |
| 2021/0134367 A1 | 5/2021 | Lee | |

* cited by examiner

Figure 1:
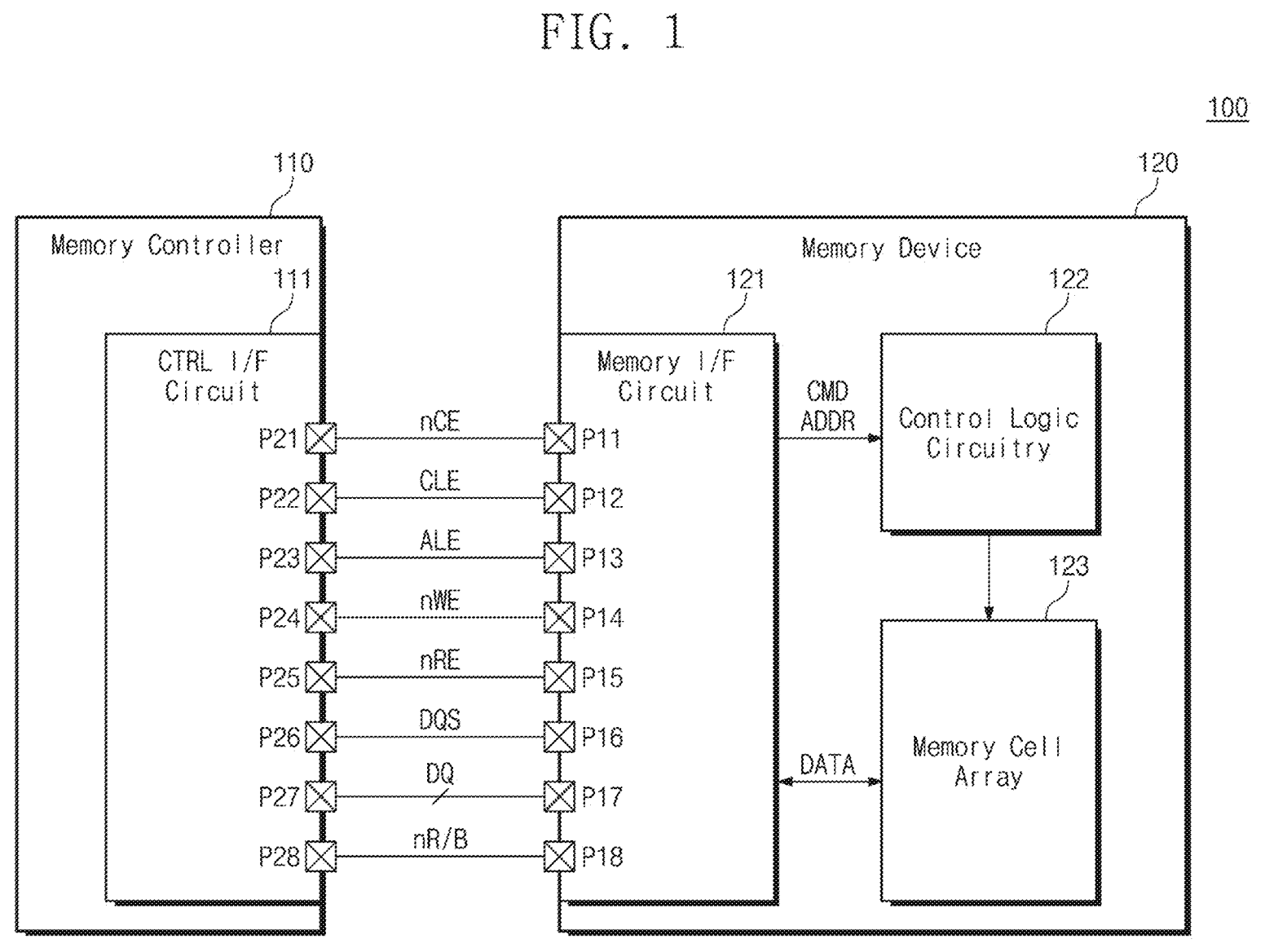

Memory Controller 110

CTRL I/F Circuit 111

P21 P22 P23 P24 P25 P26 P27 P28 nCE CLE ALE nWE nRE DQS DQ nR/B

P11 P12 P13 P14 P15 P16 P17 P18

Memory Device 120

Memory I/F Circuit 121

Control Logic Circuitry 122

Memory Cell Array 123

CMD ADDR

DATA

OPERATION METHOD OF MEMORY DEVICE USING PASS VOLTAGES

CROSS-REFERENCE TO RELATED APPLICATIONS

This application claims priority under 35 U.S.C. § 119 to Korean Patent Application Nos. 10-2022-0105796 filed on Aug. 23, 2022, and 10-2022-0140656 filed on Oct. 27, 2022, in the Korean Intellectual Property Office, the disclosures of which are incorporated by reference herein in their entireties.

BACKGROUND

Example embodiments of the present disclosure described herein relate to semiconductor memories, and more particularly, relate to operation methods of memory devices.

A semiconductor memory is classified as a volatile memory, in which stored data disappear when a power is turned off, such as a static random access memory (SRAM) or a dynamic random access memory (DRAM), or a non-volatile memory, in which stored data are retained even when a power is turned off, such as a flash memory, a phase-change RAM (PRAM), a magnetic RAM (MRAM), a resistive RAM (RRAM), or a ferroelectric RAM (FRAM).

The flash memory device is being widely used as a high-capacity storage medium. Nowadays, a flash memory device of a three-dimensional structure in which memory cells are stacked in a direction perpendicular to a substrate is being used. In addition, to improve the degree of integration of the flash memory device, a space between memory cells or word lines may narrow, which causes various issues including program disturb.

SUMMARY

Example embodiments of the present disclosure provide memory devices with improved reliability and improved performance and operation methods of the memory devices.

According to some example embodiments, an operation method of a memory device which includes a plurality of memory cells stacked in a direction perpendicular to a substrate and a plurality of word lines respectively connected with the plurality of memory cells includes applying a 0-th pass voltage to a first selected word line among the plurality of word lines and applying a first pass voltage to a first upper adjacent word line among the plurality of word lines, during a first word line setup period, and applying a first program voltage to the first selected word line and applying a second pass voltage smaller than the first pass voltage to the first upper adjacent word line, during a first program execution period after the first word line setup period. The first upper adjacent word line is a word line physically adjacent to the first selected word line.

According to some example embodiments, an operation method of a memory device which includes a plurality of memory cells stacked in a direction perpendicular to a substrate and a plurality of word lines respectively connected with the plurality of memory cells includes applying a 0-th pass voltage to a first selected word line among the plurality of word lines and applying a first pass voltage to a first upper adjacent word line adjacent to the first selected word line from among the plurality of word lines, in a first word line setup period of a first program loop, applying a first program voltage to the first selected word line and applying a second pass voltage smaller than the first pass voltage to the first upper adjacent word line, in a first program execution period of the first program loop after the first word line setup period, applying the 0-th pass voltage to the first selected word line and applying a third pass voltage to the first upper adjacent word line, in a second word line setup period of a second program loop, and applying a second program voltage greater than the first program voltage to the first selected word line and applying a fourth pass voltage to the first upper adjacent word line, in a second program execution period of the second program loop after the second word line setup period.

According to some example embodiments, an operation method of a memory device which includes a plurality of memory cells stacked in a direction perpendicular to a substrate and a plurality of word lines respectively connected with the plurality of memory cells includes performing a first program operation on a first selected word line among of the plurality of word lines, and performing a second program operation on a second selected word line different from the first selected word line from among of the plurality of word lines. The first program operation includes applying a 0-th pass voltage to the first selected word line and applying a first pass voltage to a first upper adjacent word line, in a first word line setup period, and applying a first program voltage to the first selected word line and applying a second pass voltage smaller than the first pass voltage to the first upper adjacent word line, in a first program execution period after the first word line setup period. The second program operation includes applying the 0-th pass voltage to the second selected word line and applying a third pass voltage greater than the first pass voltage to a second upper adjacent word line, in a second word line setup period, and applying the first program voltage to the second selected word line and applying a fourth pass voltage greater than the second pass voltage to the second upper adjacent word line, in a second program execution period after the second word line setup period. A first distance from the first selected word line to the first upper adjacent word line is smaller than a second distance from the second selected word line to the second upper adjacent word line.

BRIEF DESCRIPTION OF THE FIGURES

The above and other objects and features of the present disclosure will become apparent by describing in detail example embodiments thereof with reference to the accompanying drawings.

FIG. 1 is a block diagram illustrating a memory system according to some example embodiments of the present disclosure.

DETAILED DESCRIPTION

Figure 2:
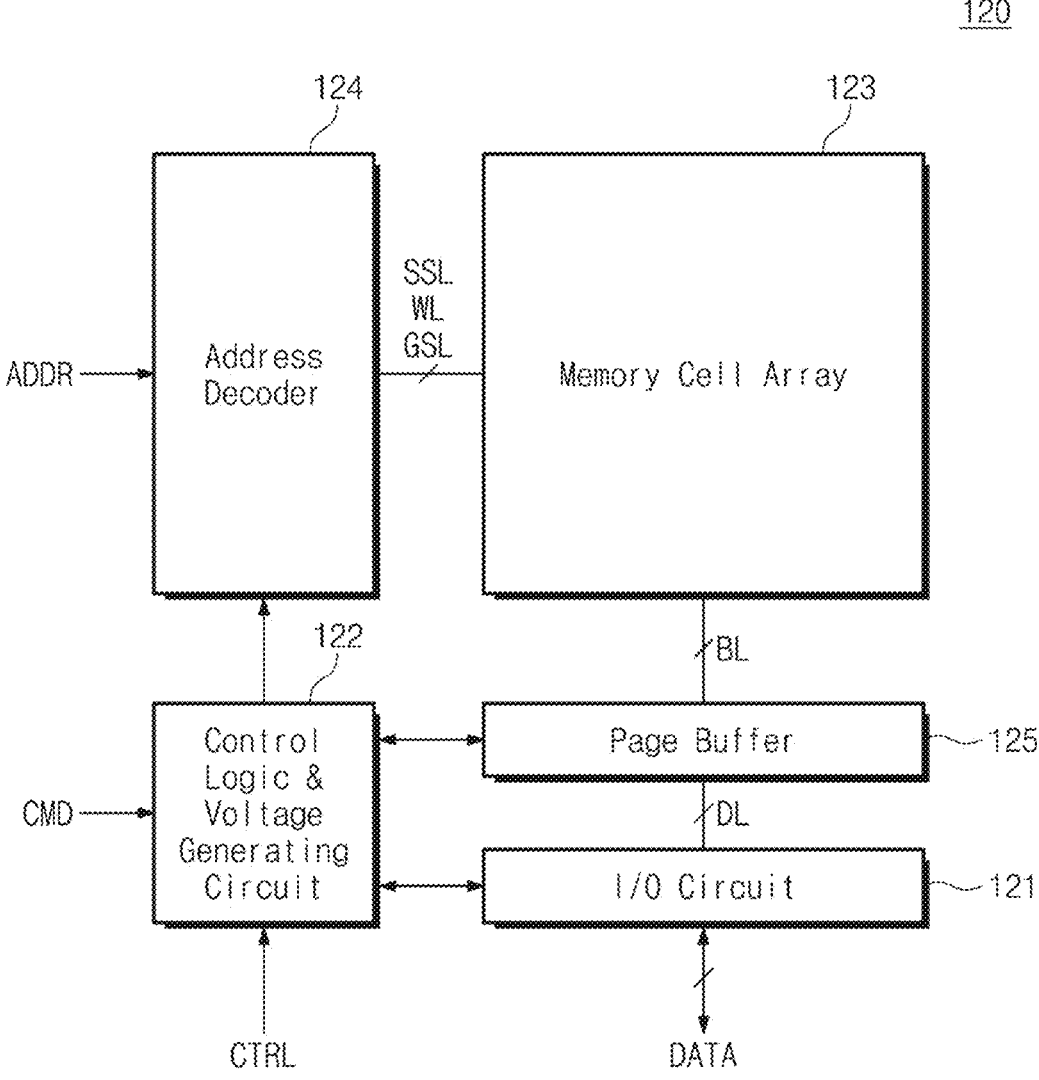
FIG. 2 is a block diagram illustrating a memory device of FIG. 1 in detail.

Below, example embodiments of the present disclosure will be described in detail and clearly to such an extent that an ordinary one in the art easily implements the inventive concepts.

FIG. 1 is a block diagram of a memory system according to some example embodiments. Referring to FIG. 1, the memory system 100 may include a memory controller 110 and a memory device 120.

The memory controller 110 may include first to eighth pins P21 to P28 and a controller interface circuitry 111. The first to eighth pins P21 to P28 may respectively correspond to the first to eighth pins P11 to P18 of the memory device 120.

The controller interface circuitry 111 may transmit a chip enable signal nCE to the memory device 120 through the first pin P21. The controller interface circuitry 111 may transmit and receive signals to and from the memory device 120, which is selected by the chip enable signal nCE, through the second to eighth pins P22 to P28.

The controller interface circuitry 111 may transmit the command latch enable signal CLE, the address latch enable signal ALE, and the write enable signal nWE to the memory device 120 through the second to fourth pins P22 to P24. The controller interface circuitry 111 may transmit or receive the data signal DQ to and from the memory device 120 through the seventh pin P27.

The controller interface circuitry 111 may transmit the data signal DQ including the command CMD or the address ADDR to the memory device 120 along with the write enable signal nWE, which toggles. The controller interface circuitry 111 may transmit the data signal DQ including the command CMD to the memory device 120 by transmitting a command latch enable signal CLE having an enable state. Also, the controller interface circuitry 111 may transmit the data signal DQ including the address ADDR to the memory device 120 by transmitting an address latch enable signal ALE having an enable state.

The controller interface circuitry 111 may transmit the read enable signal nRE to the memory device 120 through the fifth pin P25. The controller interface circuitry 111 may receive or transmit the data strobe signal DQS from or to the memory device 120 through the sixth pin P26.

In a data (DATA) output operation of the memory device 120, the controller interface circuitry 111 may generate a read enable signal nRE, which toggles, and transmit the read enable signal nRE to the memory device 120. For example, before outputting data DATA, the controller interface circuitry 111 may generate a read enable signal nRE, which is changed from a static state (e.g., a high level or a low level) to a toggling state. Thus, the memory device 120 may generate a data strobe signal DQS, which toggles, based on the read enable signal nRE. The controller interface circuitry 111 may receive the data signal DQ including the data DATA along with the data strobe signal DQS, which toggles, from the memory device 120. The controller interface circuitry 111 may obtain the data DATA from the data signal DQ based on a toggle time point of the data strobe signal DQS.

In a data (DATA) input operation of the memory device 120, the controller interface circuitry 111 may generate a data strobe signal DQS, which toggles. For example, before transmitting data DATA, the controller interface circuitry 111 may generate a data strobe signal DQS, which is changed from a static state (e.g., a high level or a low level) to a toggling state. The controller interface circuitry 111 may transmit the data signal DQ including the data DATA to the memory device 120 based on toggle time points of the data strobe signal DQS.

The controller interface circuitry 111 may receive a ready/busy output signal nR/B from the memory device 120 through the eighth pin P28. The controller interface circuitry 111 may determine state information of the memory device 120 based on the ready/busy output signal nR/B.

The memory device 120 may include first to eighth pins P11 to P18, a memory interface circuitry 121, a control logic circuitry 122, and a memory cell array 123.

The memory interface circuitry 121 may receive a chip enable signal nCE from the memory controller 110 through the first pin P11. The memory interface circuitry 121 may transmit and receive signals to and from the memory controller 110 through the second to eighth pins P12 to P18 in response to the chip enable signal nCE. For example, when the chip enable signal nCE is in an enable state (e.g., a low level), the memory interface circuitry 121 may transmit and receive signals to and from the memory controller 110 through the second to eighth pins P12 to P18.

The memory interface circuitry 121 may receive a command latch enable signal CLE, an address latch enable signal ALE, and a write enable signal nWE from the memory controller 110 through the second to fourth pins P12 to P14. The memory interface circuitry 121 may receive a data signal DQ from the memory controller 110 through the seventh pin P17 or transmit the data signal DQ to the memory controller 110. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 121 may obtain the command CMD from the data signal DQ, which is received in an enable section (e.g., a high-level state) of the command latch enable signal CLE based on toggle time points of the write enable signal nWE. The memory interface circuitry 121 may obtain the address ADDR from the data signal DQ, which is received in an enable section (e.g., a high-level state) of the address latch enable signal ALE based on the toggle time points of the write enable signal nWE.

In some example embodiments, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 121 may obtain the command CMD or the address ADDR based on toggle time points of the write enable signal nWE.

The memory interface circuitry 121 may receive a read enable signal nRE from the memory controller 110 through the fifth pin P15. The memory interface circuitry 121 may receive a data strobe signal DQS from the memory controller 110 through the sixth pin P16 or transmit the data strobe signal DQS to the memory controller 110.

In a data (DATA) output operation of the memory device 120, the memory interface circuitry 121 may receive the read enable signal nRE, which toggles through the fifth pin P15, before outputting the data DATA. The memory interface circuitry 121 may generate the data strobe signal DQS, which toggles based on the toggling of the read enable signal nRE. For example, the memory interface circuitry 121 may generate a data strobe signal DQS, which starts toggling after a predetermined delay (e.g., tDQSRE), based on a toggling start time of the read enable signal nRE. The memory interface circuitry 121 may transmit the data signal DQ including the data DATA based on a toggle time point of the data strobe signal DQS. Thus, the data DATA may be aligned with the toggle time point of the data strobe signal DQS and transmitted to the memory controller 110.

In a data (DATA) input operation of the memory device 120, when the data signal DQ including the data DATA is received from the memory controller 110, the memory interface circuitry 121 may receive the data strobe signal DQS, which toggles, along with the data DATA from the memory controller 110. The memory interface circuitry 121 may obtain the data DATA from the data signal DQ based on toggle time points of the data strobe signal DQS. For example, the memory interface circuitry 121 may sample the data signal DQ at rising and falling edges of the data strobe signal DQS and obtain the data DATA.

The memory interface circuitry 121 may transmit a ready/busy output signal nR/B to the memory controller 110 through the eighth pin P18. The memory interface circuitry 121 may transmit state information of the memory device 120 through the ready/busy output signal nR/B to the memory controller 110. When the memory device 120 is in a busy state (e.g., when operations are being performed in the memory device 120), the memory interface circuitry 121 may transmit a ready/busy output signal nR/B indicating the busy state to the memory controller 110. When the memory device 120 is in a ready state (e.g., when operations are not performed or completed in the memory device 120), the memory interface circuitry 121 may transmit a ready/busy output signal nR/B indicating the ready state to the memory controller 110. For example, while the memory device 120 is reading data DATA from the memory cell array 123 in response to a page read command, the memory interface circuitry 121 may transmit a ready/busy output signal nR/B indicating a busy state (e.g., a low level) to the memory controller 110. For example, while the memory device 120 is programming data DATA to the memory cell array 123 in response to a program command, the memory interface circuitry 121 may transmit a ready/busy output signal nR/B indicating the busy state to the memory controller 110.

The control logic circuitry 122 may control all operations of the memory device 120. The control logic circuitry 122 may receive the command/address CMD/ADDR obtained from the memory interface circuitry 121. The control logic circuitry 122 may generate control signals for controlling other components of the memory device 120 in response to the received command/address CMD/ADDR. For example, the control logic circuitry 122 may generate various control signals for programming data DATA to the memory cell array 123 or reading the data DATA from the memory cell array 123.

The memory cell array 123 may store the data DATA obtained from the memory interface circuitry 121, via the control of the control logic circuitry 122. The memory cell array 123 may output the stored data DATA to the memory interface circuitry 121 via the control of the control logic circuitry 122.

The memory cell array 123 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, some example embodiments in which the memory cells are NAND flash memory cells will mainly be described.

FIG. 2 is a block diagram illustrating the memory device 120 of FIG. 1 in detail. Referring to FIG. 2, the memory device 120 may include the input/output circuit 121, the control logic and voltage generating circuit 122, the memory cell array 123, an address decoder 124, and a page buffer 125.

The input/output circuit 121 may be similar to the memory interface circuit 121 of FIG. 1, and thus, additional description will be omitted to avoid redundancy.

The control logic and voltage generating circuit 122 (hereinafter referred to as a "control logic circuit 122") may be similar to the control logic circuitry 122 of FIG. 1, and thus, additional description will be omitted to avoid redundancy. For example, the control logic circuit 122 may receive a command CMD from the memory controller 110 (or through the input/output circuit 121) and may control various components of the memory device 120 in response to the command CMD. In some example embodiments, the control logic circuit 122 may generate various voltages necessary for the memory device 120 to operate. For example, the various voltages may include a plurality of program voltages, a plurality of pass voltages, a plurality of verification voltages, a plurality of read voltages, a plurality of non-selection read voltages, a plurality of erase voltages, etc.

The memory cell array 123 may include a plurality of memory blocks. Each of the plurality of memory blocks may include a plurality of cell strings connected with a plurality of bit lines. Each of the plurality of cell strings may include a plurality of cell transistors, which are connected with string selection lines SSL, word lines WL, and ground selection lines GSL. A structure of a memory block will be described in detail with reference to FIG. 3.

The address decoder 124 may be connected with the memory cell array 123 through the string selection lines SSL, the word lines WL, and the ground selection lines GSL. The address decoder 124 may receive an address ADDR from the memory controller 110 (or through the input/output circuit 121). The address decoder 124 may decode the address ADDR and may control the string selection lines SSL, the word lines WL, and the ground selection lines GSL based on the decoding result.

The page buffer 125 may be connected with the memory cell array 123 through bit lines BL. The page buffer 125 may read data stored in the memory cell array 123 by detecting voltage changes of the bit lines BL. The page buffer 125 may transfer the read data to the input/output circuit 121. Alternatively, the page buffer 125 may control voltages of the bit lines BL based on data received from the input/output circuit 121 through data lines DL.

Figure 3:
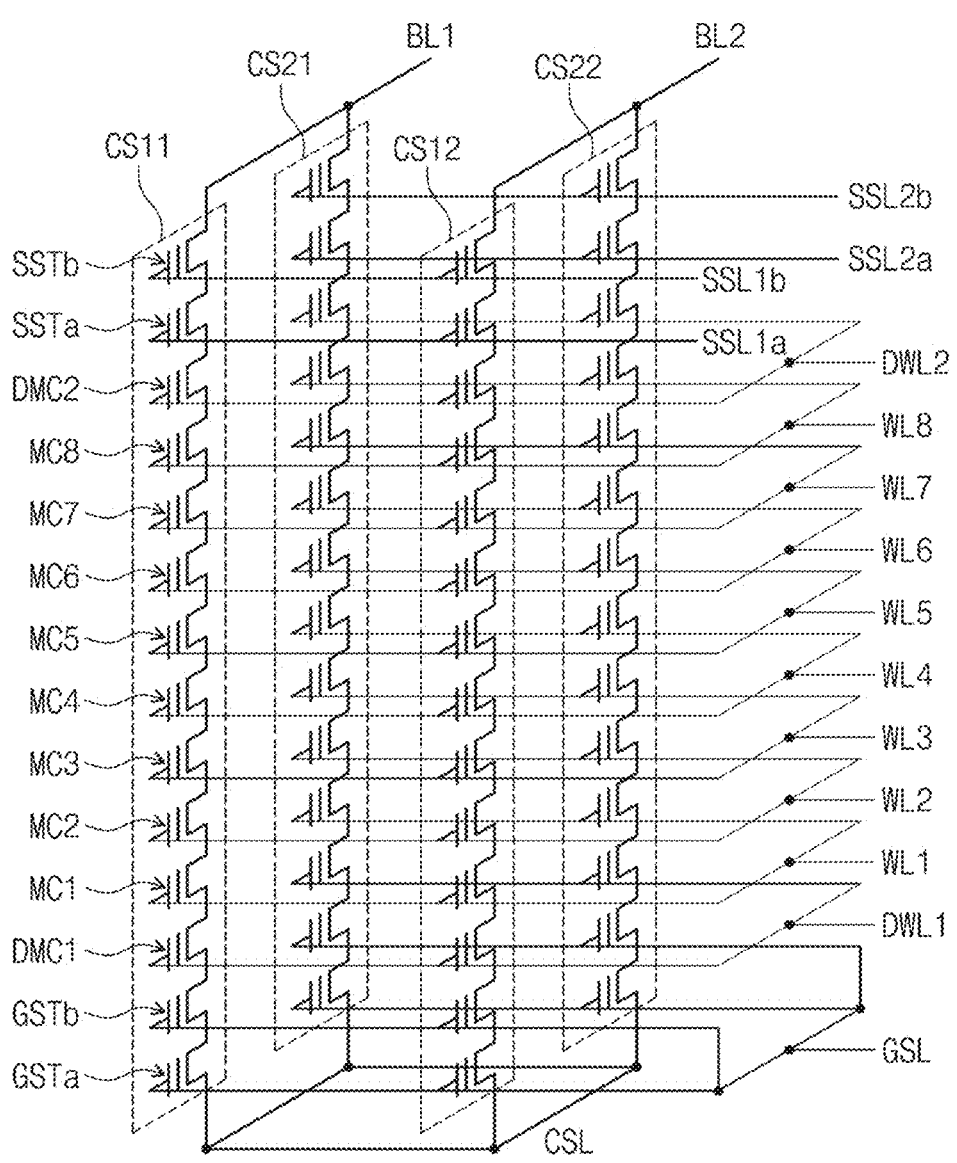
FIG. 3 is a diagram illustrating an example of a memory block included in a memory cell array of FIG. 2.
Figure 3:
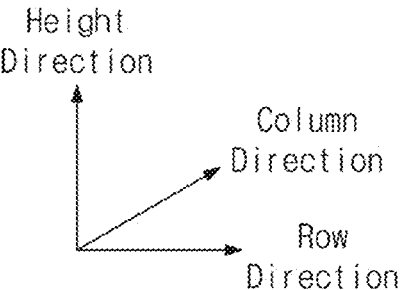

FIG. 3 is a diagram illustrating an example of a memory block included in a memory cell array of FIG. 2. In some example embodiments, a memory block of a three-dimensional structure will be described with reference to FIG. 3, but the present disclosure is not limited thereto. A memory block according to the present disclosure may have a two-dimensional memory block structure. In some example embodiments, the memory block illustrated in FIG. 3 may be a physical erase unit of the memory device 120. However, the present disclosure is not limited thereto. For example, an erase unit may be changed to a page unit, a word line unit, a sub-block unit, etc.

Referring to FIGS. 2 and 3, a memory block BLK may include a plurality of cell strings CS11, CS12, CS21, and CS22. The plurality of cell strings CS11, CS12, CS21, and CS22 may be arranged in a row direction and a column direction to form rows and columns.

Each of the plurality of cell strings CS11, CS12, CS21, and CS22 includes a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In some example embodiments, each of the plurality of cell transistors included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by a row direction and a column direction. In each cell string, the string selection transistors SSTa and SSTb may be serially connected and may be interposed between the memory cells MC1 to MC8 and the corresponding one of bit lines BL1 and BL2. The ground selection transistors GSTa and GSTb are serially connected and are interposed between the plurality of memory cells MC1 to MC8 and a common source line CSL.

In some example embodiments, in each cell string, the first dummy memory cell DMC1 may be interposed between the plurality of memory cells MC1 to MC8 and the ground selection transistors GSTa and GSTb. In some example embodiments, in each cell string, the second dummy memory cell DMC2 may be interposed between the plurality of memory cells MC1 to MC8 and the string selection transistors SSTa and SSTb.

The ground selection transistors GSTa and GSTb of the cell strings CS11, CS12, CS21, and CS22 may be connected in common with a ground selection line GSL. In some example embodiments, ground selection transistors in the same row may be connected with the same ground selection line, and ground selection transistors in different rows may be connected with different ground selection lines. For example, the first ground selection transistors GSTa of the cell strings CS11 and CS12 in the first row may be connected with a first ground selection line, and the first ground selection transistors GSTa of the cell strings CS21 and CS22 in the second row may be connected with a second ground selection line.

In some example embodiments, although not illustrated, ground selection transistors provided at the same height from a substrate (not illustrated) may be connected with the same ground selection line, and ground selection transistors provided at different heights therefrom may be connected with different ground selection lines.

Memory cells of the same height from the substrate or the ground selection transistors GSTa and GSTb are connected in common with the same word line, and memory cells of different heights therefrom are connected with different word lines. For example, the memory cells MC1 to MC8 of the cell strings CS11, CS12, CS21, and CS22 may be connected to first to eighth word lines WL1 to WL8.

String selection transistors, which belong to the same row, from among the first string selection transistors SSTa of the same height are connected to the same string selection line, and string selection transistors belonging to different rows are connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, string selection transistors, which belong to the same row, from among the second string selection transistors SSTb at the same height are connected with the same string selection line, and string selection transistors, which belong to another row, from among the second string selection transistors SSTb are connected with another string selection line. For example, the second string selection transistors SSTb of the cell strings CS11 and CS12 in the first row are connected in common with a string selection line SSL1b, and the second string selection transistors SSTb of the cell strings CS21 and CS22 in the second row may be connected in common with a string selection line SSL2b.

In some example embodiments, dummy memory cells of the same height are connected with the same dummy word line, and dummy memory cells of different heights are connected with different dummy word lines. For example, the first dummy memory cells DMC1 are connected with a first dummy word line DWL1, and the second dummy memory cells DMC2 are connected with a second dummy word line DWL2.

In some example embodiments, the memory block BLK illustrated in FIG. 3 is only an example. The number of cell strings may increase or decrease, and the number of rows of cell strings and the number of columns of cell strings may increase or decrease depending on the number of cell strings. Also, the number of cell transistors (e.g., GST, MC, DMC, and SST) in the memory block BLK may increase or decrease, and the height of the memory block BLK may increase or decrease depending on the number of cell transistors (e.g., GST, MC, DMC, and SST). In addition, the number of lines (e.g., GSL, WL, DWL, and SSL) connected with cell transistors may increase or decrease depending on the number of cell transistors.

Figure 4:
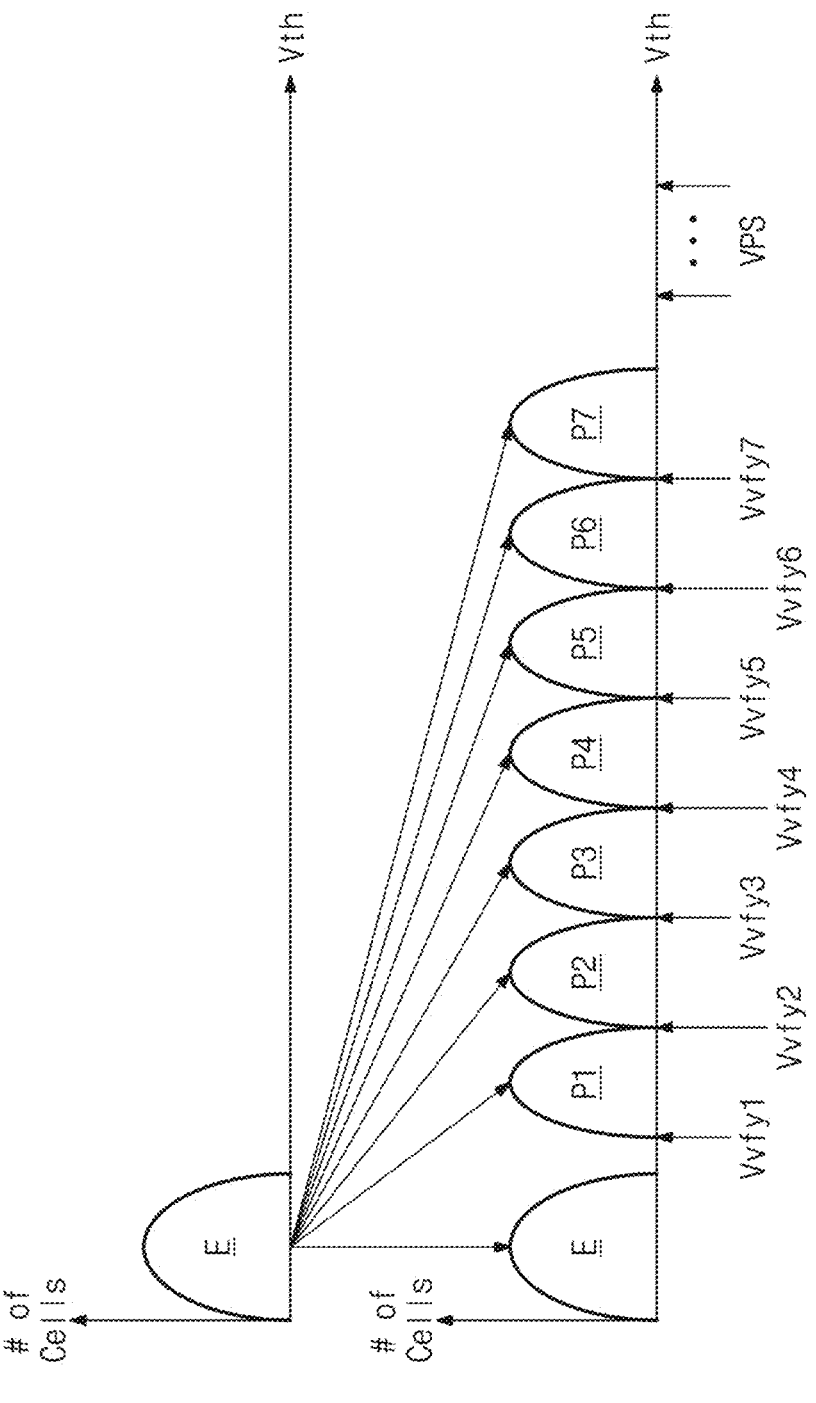
FIG. 4 is a diagram illustrating threshold voltage distributions of memory cells of FIG. 3.
Figure 5:
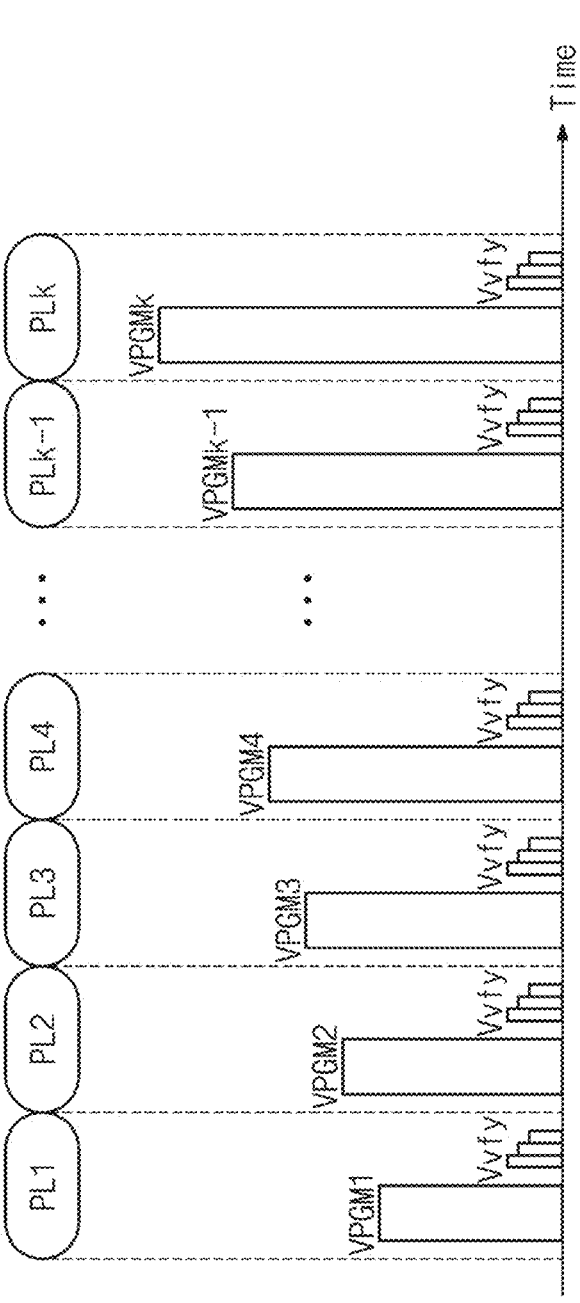
FIG. 5 is a timing diagram for describing a program operation for memory cells of FIG. 3.

FIG. 4 is a diagram illustrating threshold voltage distributions of memory cells of FIG. 3. FIG. 5 is a timing diagram for describing a program operation for memory cells of FIG. 3. In graphs of FIG. 4, a horizontal axis represents a threshold voltage Vth of a memory cell, and a vertical axis represents the number of memory cells. For convenience of description, it is assumed that each memory cell is a triple level cell (TLC) storing 3-bit data. However, the present disclosure is not limited thereto. For example, each memory cell may be implemented in the form of a single level cell (SLC), a multi-level cell (MLC), or a quadruple level cell (QLC).

Referring to FIGS. 3 to 5, the memory device 120 may perform the program operation in units of page or word line. For example, the memory cells MC1 to MC8 of the memory block BLK may have an erase state "E". The memory device 120 may perform the program operation such that memory cells connected with a selected word line from among the memory cells MC1 to MC8 have one of the erase state "E" and a plurality of program states P1 to P7.

In some example embodiments, the program operation may be performed in an incremental step pulse programming (ISPP) manner. For example, as illustrated in FIG. 5, the memory device 120 may perform a plurality of program loops PL1 to PLk. Each of the plurality of program loops PL1 to PLk may include a program step in which a program voltage (e.g., one of VPGM1 to VPGMk) is applied to the selected word line and a verify step in which a verification voltage (e.g., at least one of Vvfy1 to Vvfy7) is applied to the selected word line.

In some example embodiments, the selected word line may be connected with memory cells configured to store actual user data. For example, in the present disclosure, the selected word line may be one of the word lines WL1 to WL8 connected with memory cells (e.g., MC1 to MC8) configured to store user data. In some example embodiments, the dummy memory cells DMC1 and DMC2 connected with the dummy word lines DWL1 and DWL2, the string selection transistors SSTa and SSTb connected with the string selection lines SSL1a and SSL1b, and the ground selection transistors GSTa and GSTb connected with the ground selection line GSL may be programmed depending on a way to implement, for the purpose of the threshold voltage control thereof. However, the above cell transistors DMC1, DMC2, SSTa, SSTb, GSTa, and GSTb may not be used to store actual user data received from the memory controller 110.

In some example embodiments, in the program step of the first program loop PL1, the memory device 120 may apply the first program voltage VPGM1 to the selected word line such that threshold voltages of memory cells connected with the selected word line increase. Afterwards, in the verify step of the first program loop PL1, the memory device 120 may apply the verification voltage to the selected word line to verify program states of the memory cells connected with the selected word line. As in the above description, the memory device 120 may perform the second to k-th program loops PL2 to PLk to program the memory cells connected with the selected word line.

In some example embodiments, as the program loop is repeatedly performed, the program voltage that is applied to the selected word line may gradually increase. That is, the second program voltage VPGM2 used in the second program loop PL2 may be greater than the first program voltage VPGM1 used in the first program loop PL1, and the third program voltage VPGM3 used in the third program loop PL3 may be greater than the second program voltage VPGM2 used in the second program loop PL2.

In some example embodiments, the verification voltage Vvfy that is applied to the selected word line may include at least one of first to seventh verification voltages Vvfy1 to Vvfy7 as illustrated in FIG. 4. The first to seventh verification voltages Vvfy1 to Vvfy7 may have levels for verifying the first to seventh program states P1 to P7. As the program loop is repeatedly performed, the verification voltage Vvfy that is applied to the selected word line may change. For example, in the verify step of the first program loop PL1, the first and second verification voltages Vvfy1 and Vvfy2 may be applied to the selected word line. In the verify step of the second program loop PL2, the first, second, and third verification voltages Vvfy1, Vvfy2, and Vvfy3 may be applied to the selected word line. In the verify step of the k-th program loop PLk, the sixth and seventh verification voltages Vvfy6 and Vvfy7 may be applied to the selected word line.

In some example embodiments, the above program voltages and verification voltages are provided as an example, and the present disclosure is not limited thereto.

In some example embodiments, while the program step and the verify step of each of the plurality of program loops PL1 to PLk are performed, a pass voltage VPS may be applied to the remaining word lines (or unselected word lines) other than the selected word line. In some example embodiments, the pass voltage VPS may be higher in level than a threshold voltage of the uppermost program state (e.g., P7) as illustrated in FIG. 4. That is, the pass voltage VPS may refer to a voltage for turning on memory cells regardless of program states of the memory cells. In some example embodiments, the level of the pass voltage VPS may be variously set depending on example embodiments of the present disclosure, which will be described in detail with reference to the following drawings.

Figure 6:
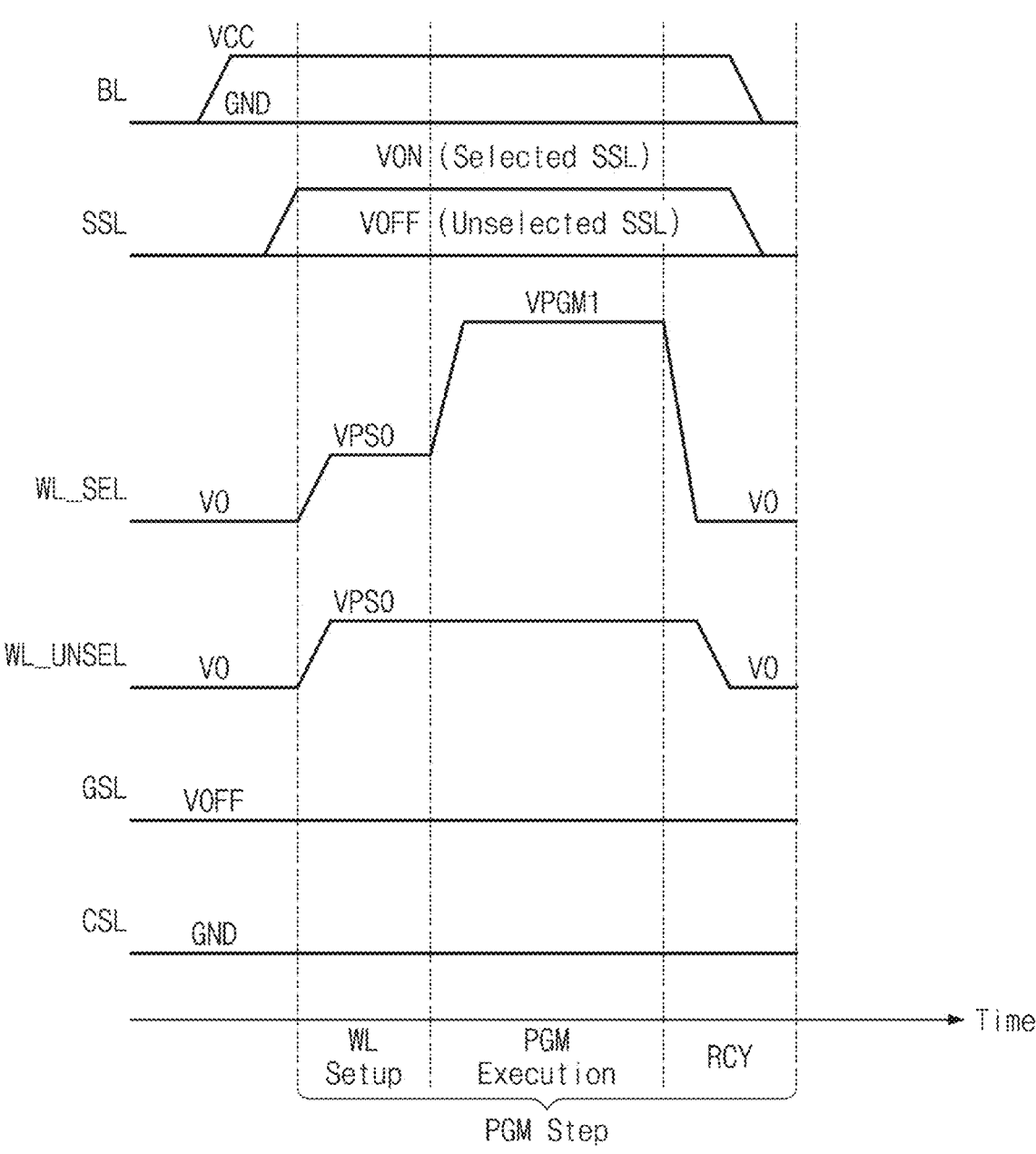
FIG. 6 is a timing diagram illustrating a program step of a first program loop among a plurality of program loops of FIG. 5 in detail.

FIG. 6 is a timing diagram illustrating a program step of a first program loop among a plurality of program loops of FIG. 5 in detail. Referring to FIGS. 2, 3, 5, and 6, the memory device 120 may perform the program operation on memory cells connected with a selected word line WL_SEL by controlling voltages of the bit line BL, the string selection line SSL, the word lines WL_SEL and WL_UNSEL, the ground selection line GSL, and the common source line CSL.

For example, one program step PGM Step may include a word line setup period WL Setup, a program execution period PGM Exec., and a recovery period RCY.

During the word line setup period WL Setup, the program execution period PGM Exec., and the recovery period RCY, one of a power supply voltage VCC and a ground voltage GND may be applied to the bit line BL depending on a program state of a corresponding memory cell. In some example embodiments, when the corresponding memory cell is a memory cell to be programmed, the ground voltage GND may be applied to the bit line BL; when the corresponding memory cell is a memory cell to be program inhibited, the power supply voltage VCC may be applied to the bit line BL.

During the word line setup period WL Setup, the program execution period PGM Exec., and the recovery period RCY, one of an on voltage VON and an off voltage VOFF may be applied to the string selection line SSL depending on a state of a corresponding cell string. For example, in the memory block BLK of FIG. 3, with regard to the first bit line BL1, when the list cell string CS11 is a selected cell string and the 21st cell string CS21 is an unselected cell string, the on voltage VON may be applied to the string selection lines SSL1a and SSL1b connected with the 11st cell string CS11, and the off voltage VOFF may be applied to the string selection lines SSL2a and SSL2b connected with the 21st cell string CS21. In some example embodiments, the on voltage VON may have a level sufficient to turn on the corresponding string selection transistors SSTa and SSTb, and the off voltage VOFF may have a level sufficient to turn off the corresponding string selection transistors SSTa and SSTb.

During the word line setup period WL Setup, the program execution period PGM Exec., and the recovery period RCY, the off voltage VOFF may be applied to the ground selection line GSL. The off voltage VOFF may have a level sufficient to turn off the ground selection transistors GSTa and GSTb connected with the ground selection line GSL.

During the word line setup period WL Setup, the program execution period PGM Exec., and the recovery period RCY, the ground voltage GND may be applied to the common source line CSL.

During the word line setup period WL Setup and the program execution period PGM Exec., a 0-th pass voltage VPS0 may be applied to the unselected word line WL_UNSEL; during the recovery period RCY, a 0-th voltage V0 may be applied to the unselected word line WL_UNSEL. The 0-th pass voltage VPS0 may have a level sufficient to turn on memory cells regardless of program states of the memory cells.

During the word line setup period WL Setup, the 0-th pass voltage VPS0 may be applied to the selected word line WL_SEL; during the program execution period PGM Exec., the first program voltage VPGM1 may be applied to the selected word line WL_SEL; during the recovery period RCY, the 0-th voltage V0 may be applied to the selected word line WL_SEL. As described above, the memory device 120 may program the memory cells connected with the selected word line WL_SEL by controlling the voltage of each line.

The above level and timing of each line are provided as an example to describe some example embodiments of the present disclosure, and the present disclosure is not limited thereto. The level and timing of each line may be variously changed or modified without departing from the scope and spirit of the inventive concepts.

In some example embodiments, in the program operation for the selected word line WL_SEL, the pass voltage that is applied to the selected word line WL_SEL may be controlled to be relatively high, such that a time taken to set up the program voltage applied to the selected word line WL_SEL is shortened. In this case, threshold voltages of memory cells may change due to the coupling between word lines, which causes the reduction of reliability of data stored in memory cells. To solve the above issue, the pass voltage that is applied to adjacent word lines may be controlled to be relatively low. In this case, the change of the threshold voltage distribution of memory cells due to the coupling between word lines may decrease; however, a time taken to set up the program voltage applied to the selected word line may increase, and the channel boosting effect for the unselected cell string or program-inhibited memory cells may decrease.

Figure 7:
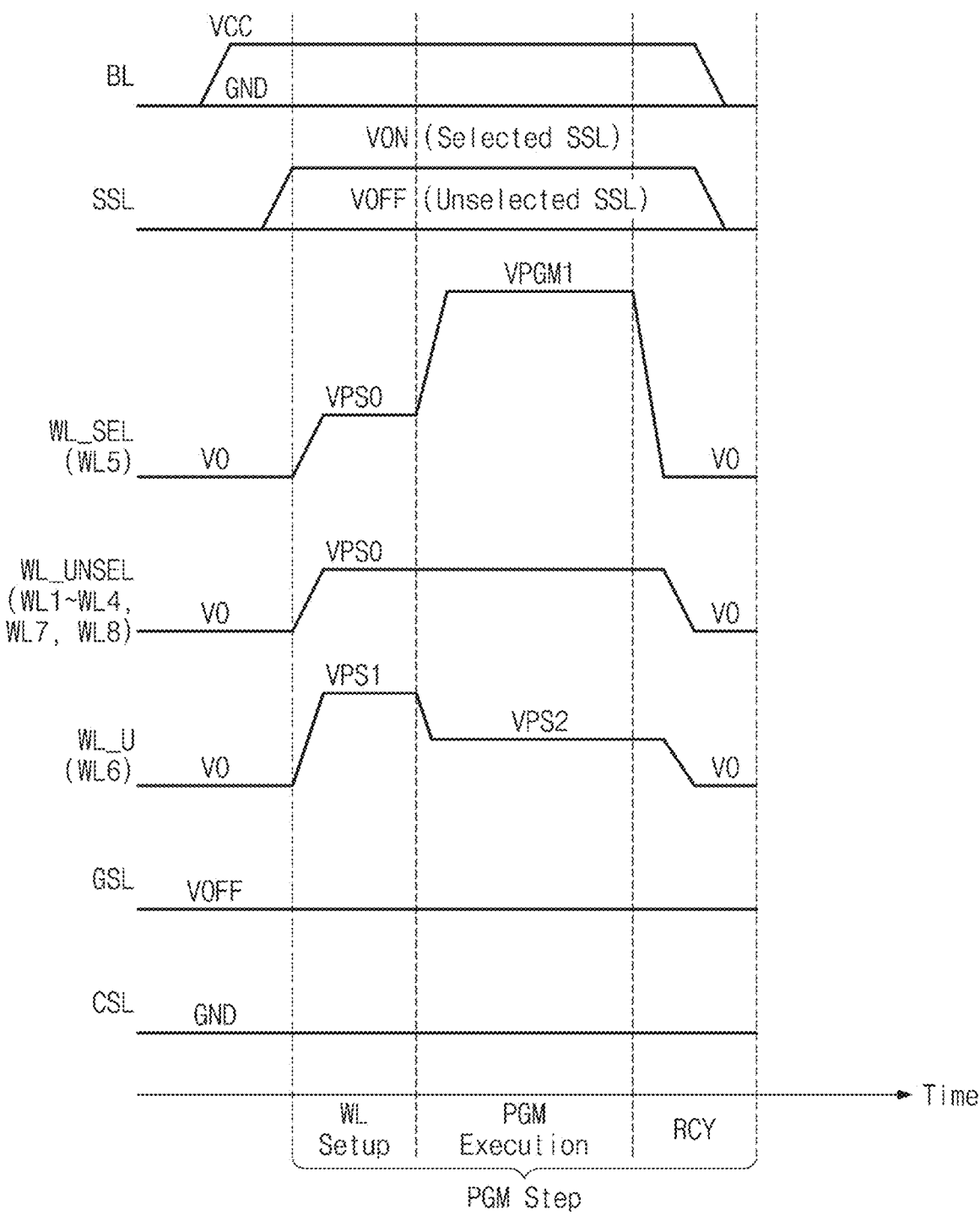
FIG. 7 is a timing diagram illustrating a program step of a first program loop among a plurality of program loops of FIG. 5 in detail.
Figure 8:
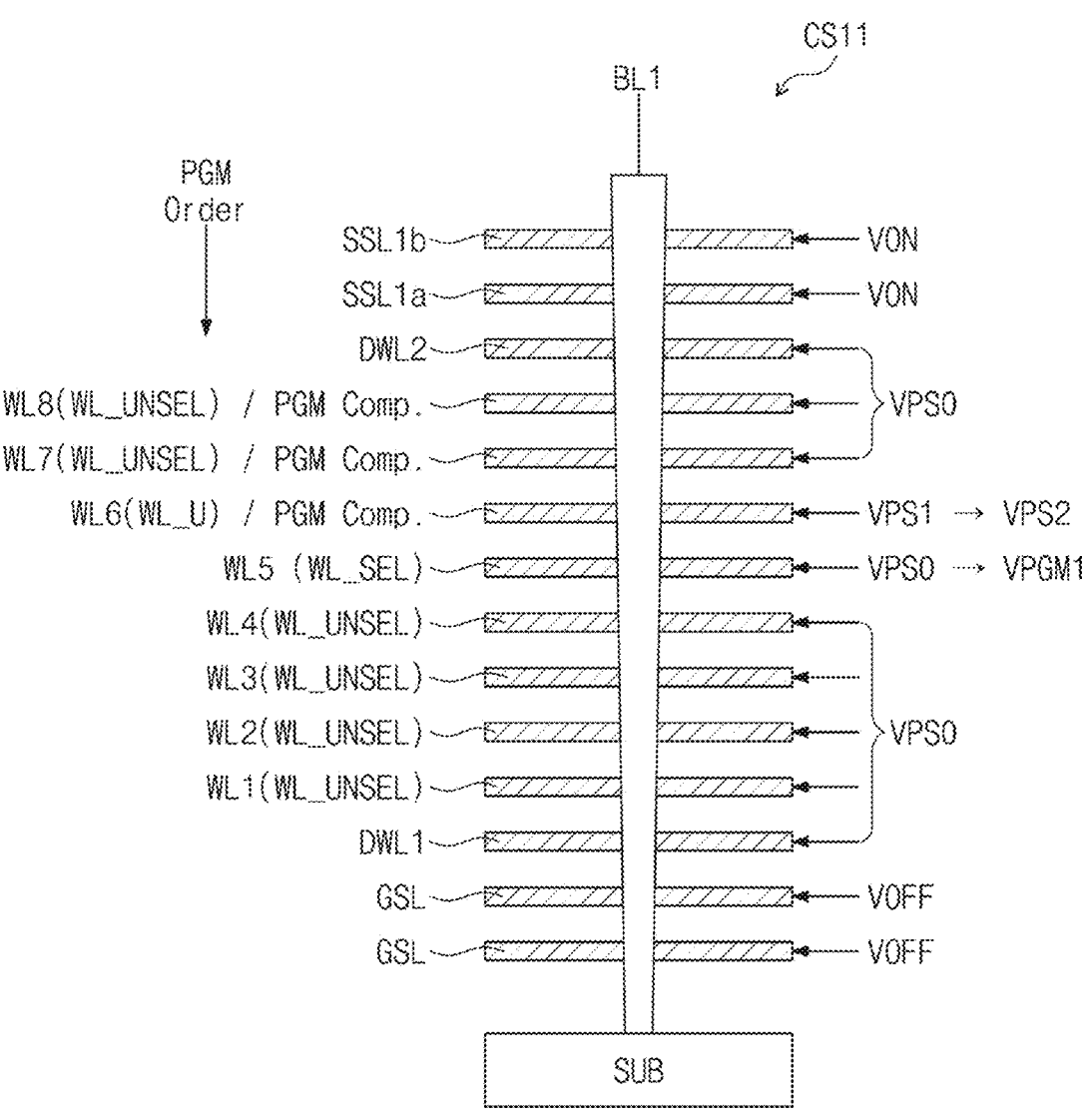
FIG. 8 is a diagram for describing a program operation according to a timing diagram of FIG. 7.

FIG. 7 is a timing diagram illustrating a program step of a first program loop among a plurality of program loops of FIG. 5 in detail. FIG. 8 is a diagram for describing a program operation according to a timing diagram of FIG. 7.

Below, to describe embodiments of the present disclosure more easily, the term "upper adjacent word line WL_U" is used. The upper adjacent word line WL_U may indicate a word line connected with memory cells, which are completely programmed, from among word lines adjacent to the selected word line WL_SEL. For example, as illustrated in FIG. 8, the memory device 120 may perform the program operation in the order from an upper word line (e.g., WL8) to a lower word line (e.g., WL1). In this case, it is assumed that the fifth word line WL5 is a selected word line.

In this case, memory cells connected with the sixth word line WL6 among the word lines WL4 and WL6 adjacent to the fifth word line WL5 are program-completed memory cells, and memory cells connected with the fourth word line WL4 are memory cells not yet programmed. That is, the sixth word line WL6 may be the upper adjacent word line WL_U based on the fifth word line WL5 being the selected word line WL_SEL.

Below, unless otherwise defined, the "unselected word line WL_UNSEL" may refer to the remaining word lines other of the plurality of word lines other than the selected word line WL_SEL and the upper adjacent word line WL_U (or below referred to as a "lower adjacent word line WL_L"). However, the term is provided as an example to describe example embodiments of the present disclosure easily, and the present disclosure is not limited thereto.

Referring to FIGS. 3, 5, 7, and 8, the memory device 120 may perform the program operation on memory cells connected with the selected word line WL_SEL by controlling voltages of the bit line BL, the string selection line SSL, the word lines WL_SEL, WL_UNSEL, and WL_U, the ground selection line GSL, and the common source line CSL.

For example, one program step PGM Step may include the word line setup period WL Setup, the program execution period PGM Exec., and the recovery period RCY. In some example embodiments, the control for the bit line BL, the string selection line SSL, the ground selection line GSL, and the common source line CSL is similar to that described with reference to FIG. 6, and thus, additional description will be omitted to avoid redundancy.

In the word line setup period WL Setup, the 0-th pass voltage VPS0 may be applied to the selected word line WL_SEL, the 0-th pass voltage VPS0 may be applied to the unselected word lines WL_UNSEL, and a first pass voltage VPS1 may be applied to the upper adjacent word line WL_U. In the program execution period PGM Exec., the first program voltage VPGM1 may be applied to the selected word line WL_SEL, and a second pass voltage VPS2 smaller than the first pass voltage VPS1 may be applied to the upper adjacent word line WL_U. In the recovery period RCY, the 0-th voltage V0 may be applied to the selected word line WL_SEL, the upper adjacent word line WL_U, and the unselected word lines WL_UNSEL.

For example, as illustrated in FIG. 8, the cell string CS11 may include a plurality of word lines stacked in a direction perpendicular to a substrate SUB. It is assumed that the selected word line WL_SEL is the fifth word line WL5. The memory device 120 may perform the program operation in the order of WL8→WL7→WL6→WL5→WL4→WL3→WL2→WL1; in this case, the sixth to eighth word lines WL6 to WL8 may be in a state of being completely programmed. Accordingly, with regard to the fifth word line WL5 being the selected word line WL_SEL, the upper adjacent word line WL_U may be the sixth word line WL6, and the unselected word lines WL_UNSEL may be the first to fourth, seventh, and eighth word lines WL1 to WL4, WL7, and WL8.

In this case, the on voltage VON may be applied to the string selection lines SSL1a and SSL1b, and the off voltage VOFF may be applied to the ground selection line GSL. The 0-th voltage V0 may be applied to the unselected word lines WL_UNSEL (e.g., WL1 to WL4, WL7, and WL8) and the dummy word lines DWL1 and DWL2.

In the word line setup period WL Setup, the 0-th pass voltage VPS0 may be applied to the selected word line WL_SEL (e.g., WL5), and the first pass voltage VPS1 may be applied to the upper adjacent word line WL_U (e.g., WL6). Afterwards, in the program execution period PGM Exec., the first program voltage VPGM1 may be applied to the selected word line WL_SEL (e.g., WL5), and the second pass voltage VPS2 may be applied to the upper adjacent word line WL_U. The second pass voltage VPS2 may be smaller than the first pass voltage VPS1. The second pass voltage VP2 may have a level sufficient to turn on memory cells regardless of program states of the memory cells.

In some example embodiments, after the recovery period RCY, the memory device 120 may perform the verify step VFY step as described with reference to FIG. 4.

As described above, according to some example embodiments of the present disclosure, the upper adjacent word line WL_U may be provided with the first pass voltage VPS1 in the word line setup period WL Setup and may be provided with the second pass voltage VPS2 smaller than the first pass voltage VPS1 in the program execution period PGM Exec. In this case, during the word line setup period WL Setup, as the first pass voltage VPS1 being relatively high is applied to the upper adjacent word line WL_U, the channel boosting efficiency may increase, and the degradation due to hot carriers may be prevented or reduced. Also, in the program execution period PGM Exec., as the second pass voltage VPS2 being relatively low is applied to the upper adjacent word line WL_U, the coupling between word lines may decrease, and the degradation of memory cells may be prevented or reduced.

Figure 9A:
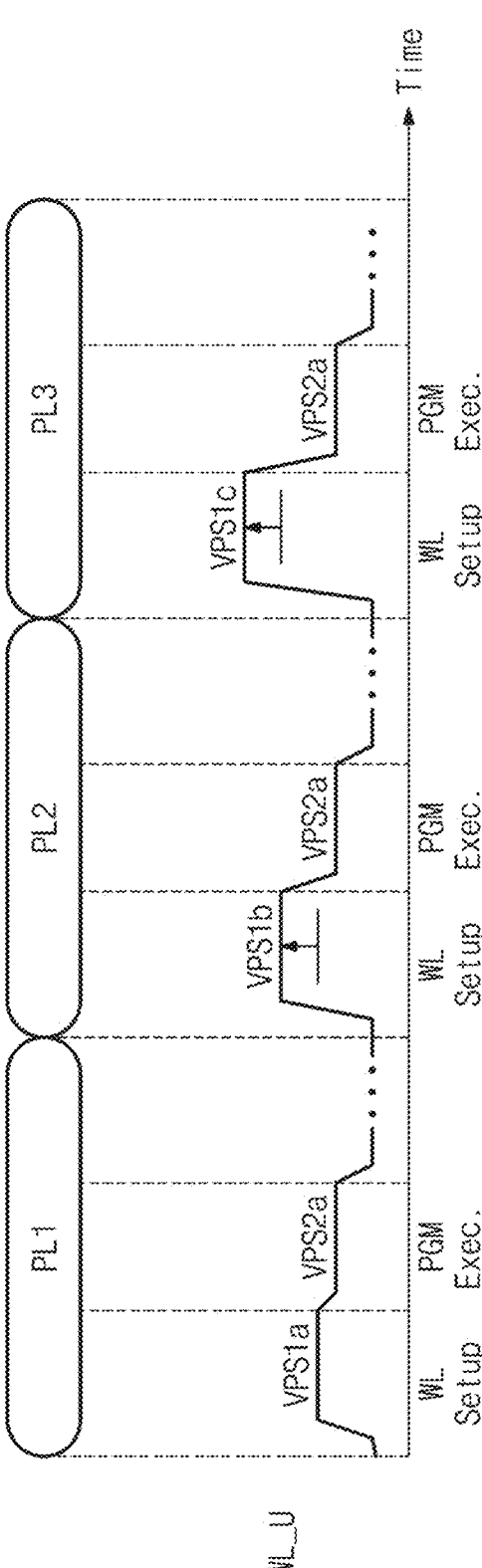
FIGS. 9A to 9C are timing diagrams for describing a program operation of a memory device of FIG. 2.
Figure 9B:
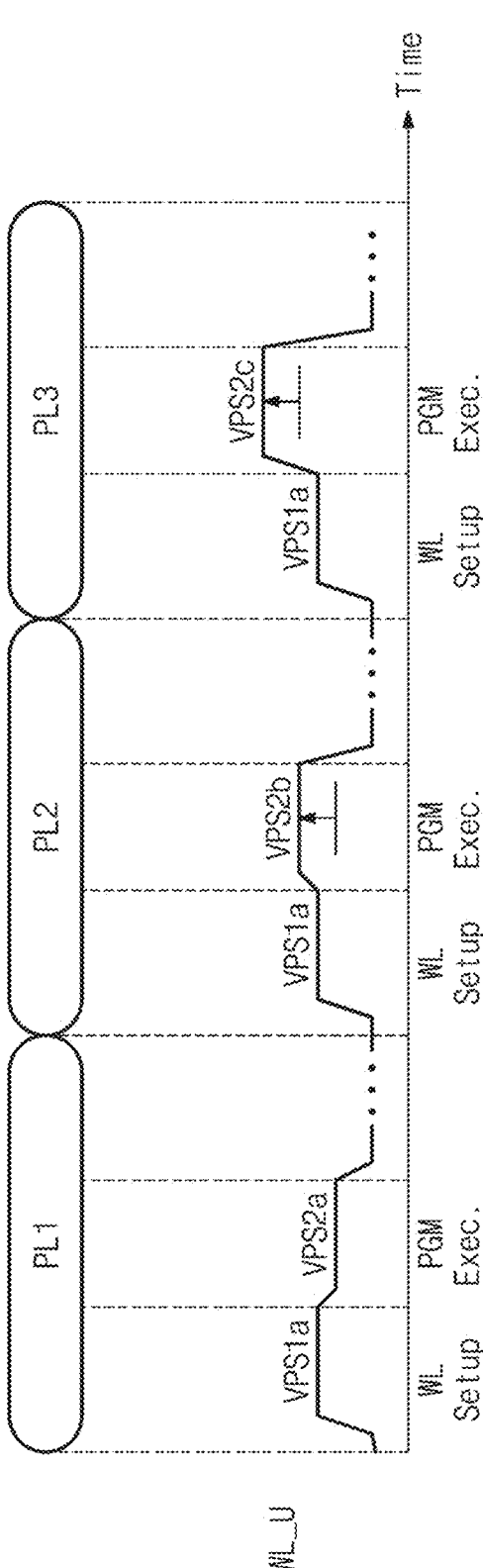
Figure 9C:
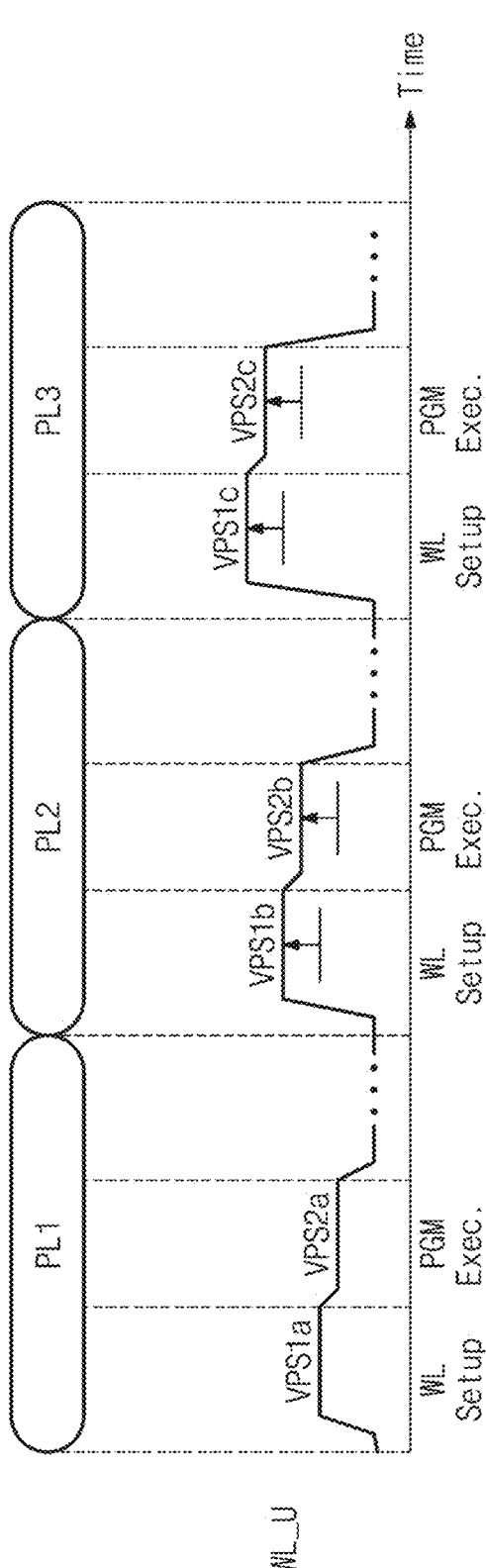

FIGS. 9A to 9C are timing diagrams for describing a program operation of a memory device of FIG. 2. For convenience of description, how the voltage of the upper adjacent word line WL_U is controlled is illustrated in the timing diagrams of FIGS. 9A to 9C. The voltage control of the remaining lines may be similar to that described with reference to FIGS. 7 and 8 and are omitted in the timing diagrams of FIGS. 9A to 9C for brevity of drawing.

Referring to FIGS. 2, 5, 7, and 9A, the memory device 120 may program the memory cells connected with the selected word line WL_SEL by sequentially performing program loops (e.g., PL1, PL2, and PL3). In this case, in the word line setup period WL Setup of each program loop, the memory device 120 may gradually increase the first pass voltage VPS1 that is applied to the upper adjacent word line WL_U.

For example, in the program step of the first program loop PL1, the memory device 120 may applied a 1a-th pass voltage VPS1$a$ to the upper adjacent word line WL_U in the word line setup period WL Setup and may apply a 2a-th pass voltage VPS2$a$ to the upper adjacent word line WL_U in the program execution period PGM Exec.

Afterwards, in the program step of the second program loop PL2, the memory device 120 may applied a 1b-th pass voltage VPS1$b$ to the upper adjacent word line WL_U in the word line setup period WL Setup and may apply the 2a-th pass voltage VPS2$a$ to the upper adjacent word line WL_U in the program execution period PGM Exec.

Afterwards, in the program step of the third program loop PL3, the memory device 120 may applied a 1c-th pass voltage VPS1$c$ to the upper adjacent word line WL_U in the word line setup period WL Setup and may apply the 2a-th pass voltage VPS2$a$ to the upper adjacent word line WL_U in the program execution period PGM Exec.

In some example embodiments, the 1b-th pass voltage VPS1$b$ may be greater than the 1a-th pass voltage VPS1$a$, and the 1c-th pass voltage VPS1$c$ may be greater than the 1b-th pass voltage VPS1$b$. That is, as the program loop is repeatedly performed, the first pass voltage VPS1 that is applied to the upper adjacent word line WL_U may gradually increase in the word line setup period WL Setup of each program loop.

Referring to FIGS. 2, 5, 7, and 9B, the memory device 120 may program the memory cells connected with the selected word line WL_SEL by sequentially performing program loops (e.g., PL1, PL2, and PL3). In this case, in the program execution period PGM Exec. of each program loop, the memory device 120 may gradually increase the second pass voltage VPS2 that is applied to the upper adjacent word line WL_U.

For example, in the program step of the first program loop PL1, the memory device 120 may apply the 1a-th pass voltage VPS1$a$ to the upper adjacent word line WL_U in the word line setup period WL Setup and may apply the 2a-th pass voltage VPS2$a$ to the upper adjacent word line WL_U in the program execution period PGM Exec.

Afterwards, in the program step of the second program loop PL2, the memory device 120 may apply the 1a-th pass voltage VPS1$a$ to the upper adjacent word line WL_U in the word line setup period WL Setup and may apply a 2b-th pass voltage VPS2$b$ to the upper adjacent word line WL_U in the program execution period PGM Exec.

Afterwards, in the program step of the third program loop PL3, the memory device 120 may apply the 1a-th pass voltage VPS1$a$ to the upper adjacent word line WL_U in the word line setup period WL Setup and may apply a 2c-th pass voltage VPS2$c$ to the upper adjacent word line WL_U in the program execution period PGM Exec.

In some example embodiments, the 2b-th pass voltage VPS2$b$ may be greater than the 2a-th pass voltage VPS2$a$, and the 2c-th pass voltage VPS2$c$ may be greater than the 2b-th pass voltage VPS2$b$. That is, as the program loop is repeatedly performed, a pass voltage that is applied to the upper adjacent word line WL_U may gradually increase in the program execution period PGM Exec. of each program loop.

Referring to FIGS. 2, 5, 7, and 9C, the memory device 120 may program the memory cells connected with the selected word line WL_SEL by sequentially performing program loops (e.g., PL1, PL2, and PL3). In this case, the memory device 120 may gradually increase the first pass voltage VPS1 applied to the upper adjacent word line WL_U in the word line setup period WL Setup of each program loop and may gradually increase the second pass voltage VPS2 applied to the upper adjacent word line WL_U in the program execution period PGM Exec. of each program loop.

For example, in the program step of the first program loop PL1, the memory device 120 may apply the 1a-th pass voltage VPS1$a$ to the upper adjacent word line WL_U in the word line setup period WL Setup and may apply the 2a-th pass voltage VPS2$a$ to the upper adjacent word line WL_U in the program execution period PGM Exec.

Afterwards, in the program step of the second program loop PL2, the memory device 120 may apply the 1b-th pass voltage VPS1$b$ to the upper adjacent word line WL_U in the word line setup period WL Setup and may apply the 2b-th pass voltage VPS2$b$ to the upper adjacent word line WL_U in the program execution period PGM Exec.

Afterwards, in the program step of the third program loop PL3, the memory device 120 may apply the 1c-th pass voltage VPS1$c$ to the upper adjacent word line WL_U in the word line setup period WL Setup and may apply the 2c-th pass voltage VPS2$c$ to the upper adjacent word line WL_U in the program execution period PGM Exec.

In some example embodiments, the 1b-th pass voltage VPS1$b$ may be greater than the 1a-th pass voltage VPS1$a$, and the 1c-th pass voltage VPS1$c$ may be greater than the 1b-th pass voltage VPS1$b$. The 2b-th pass voltage VPS2$b$ may be greater than the 2a-th pass voltage VPS2$a$, and the 2c-th pass voltage VPS2*c* may be greater than the 2b-th pass voltage VPS2*b*. That is, as the program loop is repeatedly performed, a pass voltage that is applied to the upper adjacent word line WL_U may gradually increase in the word line setup period WL Setup and the program execution period PGM Exec. of each program loop.

In some example embodiments, in each of the timing diagrams of FIGS. 9A to 9C, only the first to third program loops PL1 to PL3 are illustrated, but the present disclosure is not limited thereto. For example, the memory device 120 may further perform additional program loops. As the additional program loops are sequentially performed, the first pass voltage VPS1 applied to the upper adjacent word line WL_U in the word line setup period WL Setup or the second pass voltage VPS2 applied to the upper adjacent word line WL_U in the program execution period PGM Exec. may gradually increase.

Figure 10:
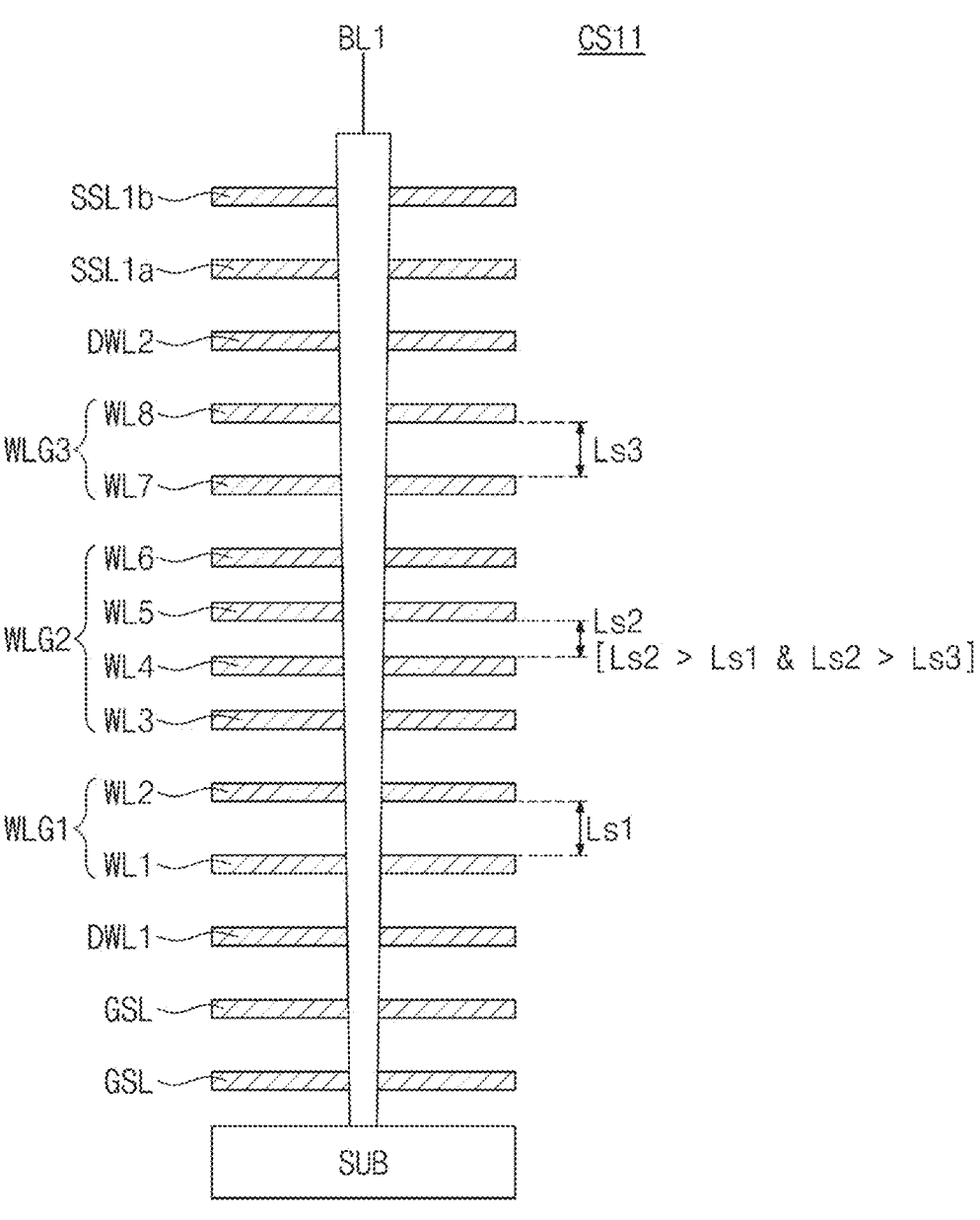
FIG. 10 is a diagram illustrating a cell string of a memory block of FIG. 3.

FIG. 10 is a diagram illustrating a cell string of a memory block of FIG. 3. Referring to FIGS. 3 and 10, the cell string CS11 may include the plurality of lines GSL, DWL1, WL1 to WL8, DWL2, SSL1*a*, and SSL1*b* stacked on the substrate SUB. A structure of the cell string CS11 is described in detail with reference to FIG. 3, and thus, additional description will be omitted to avoid redundancy.

In some example embodiments, word line spaces (e.g., Ls1, Ls2, and Ls3) between the plurality of lines GSL, DWL1, WL1 to WL8, DWL2, SSL1*a*, and SSL1*b* may be different depending on heights or physical locations from the substrate SUB. In some example embodiments, the word line space may indicate a distance (or height) between two word lines adjacent to each other.

For example, the plurality of word lines WL1 to WL8 may be divided into first to third word line groups WLG1, WLG2, and WLG3. The first word line group WLG1 may include the first and second word lines WL1 and WL2 relatively adjacent to the substrate SUB from among the plurality of word lines WL1 to WL8. The second word line group WLG2 may include the third to sixth word lines WL3 to WL6 higher than the first word line group WLG1 from the substrate SUB from among the plurality of word lines WL1 to WL8. The third word line group WLG3 may include the seventh and eighth word lines WL7 and WL8 higher than the second word line group WLG2 from the substrate SUB from among the plurality of word lines WL1 to WL8.

In this case, word lines included in the first word line group WLG1 may be spaced from each other as much as a first space Ls1. For example, the first and second word lines WL1 and WL2 may be spaced apart from each other by the first space Ls1. Word lines included in the second word line group WLG2 may be spaced from each other as much as a second space Ls2. For example, the fourth and fifth word lines WL4 and WL5 may be spaced apart from each other by the second space Ls2. Word lines included in the third word line group WLG3 may be spaced from each other as much as a third space Ls3. For example, the seventh and eighth word lines WL7 and WL8 may be spaced apart from each other by the third space Ls3.

In some example embodiments, the second space Ls2 may be smaller than the first space Ls1, and the second space Ls2 may be smaller than the third space Ls3. That is, word line spaces may be different depending on heights or physical locations from the substrate SUB. When the word line space becomes smaller, the coupling between word lines increases in the program operation; in this case, threshold voltages of memory cells increase. This causes the reduction of reliability of data stored in the memory cells, and the reduction of reliability of the memory cells is called program disturb.

According to some example embodiments of the present disclosure, the memory device 120 may control the pass voltage applied to the upper adjacent word line depending on a word line space (or distance) between the selected word line and the upper adjacent word line. For example, when the space between the selected word line and the upper adjacent word line is relatively small, in the word line setup period and the program execution period, the memory device 120 may make the pass voltage applied to the upper adjacent word line relatively low. In this case, the coupling between word lines may decrease, and the program disturb for memory cells may decrease or may be prevented. A way to control a voltage will be described in detail with reference to the following drawings.

In some example embodiments, the word line groups WLG1, WGL2, and WLG3 illustrated in FIG. 10 are provided as an example to describe some example embodiments of the present disclosure easily, and the present disclosure is not limited thereto. For example, the memory block BLK may include additional word lines, and adjacent word lines may change depending on a physical location or height of each word line from the substrate SUB. The plurality of word lines may be divided into a plurality of word line groups depending on word line spaces.

Figure 11:
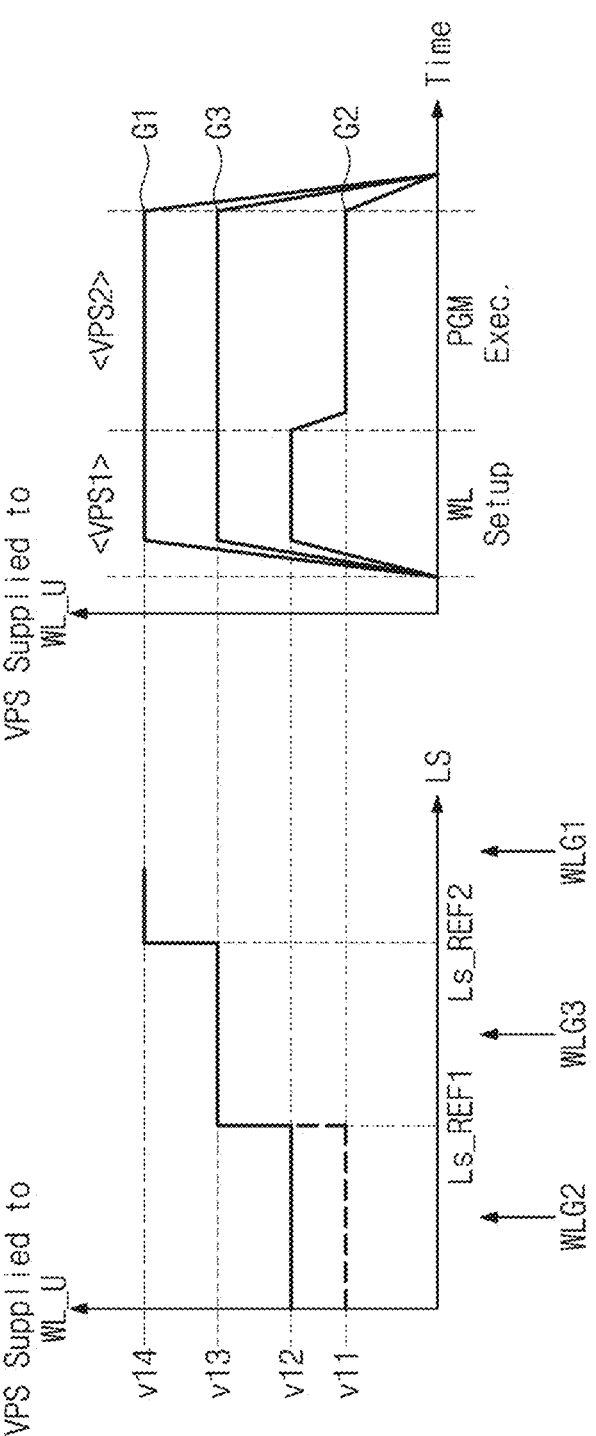
FIG. 11 is a diagram for describing a program operation for a cell string of FIG. 10.
Figure 12A:
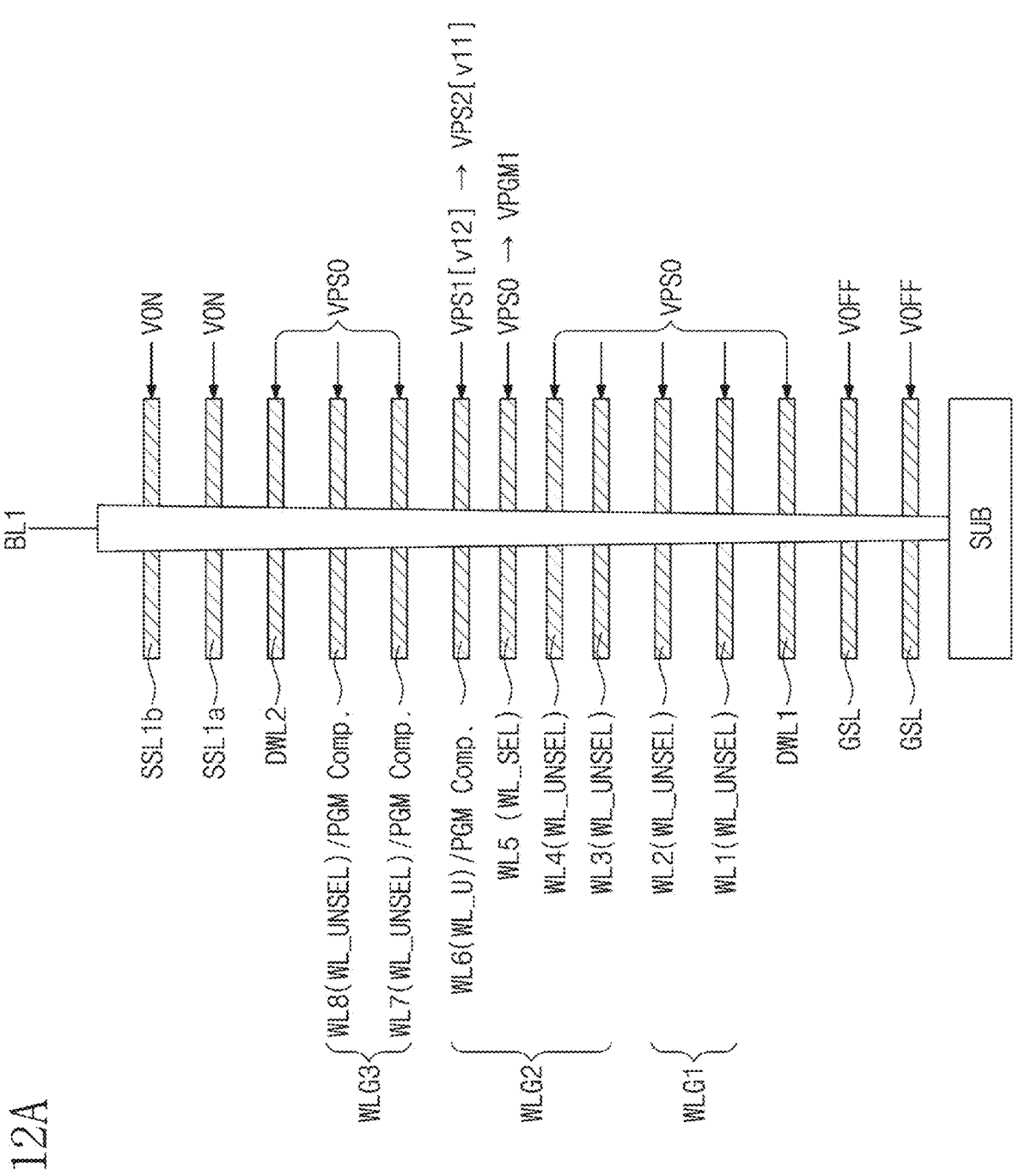
FIGS. 12A and 12B are diagrams for describing a program operation of FIG. 11 in detail.
Figure 12B:
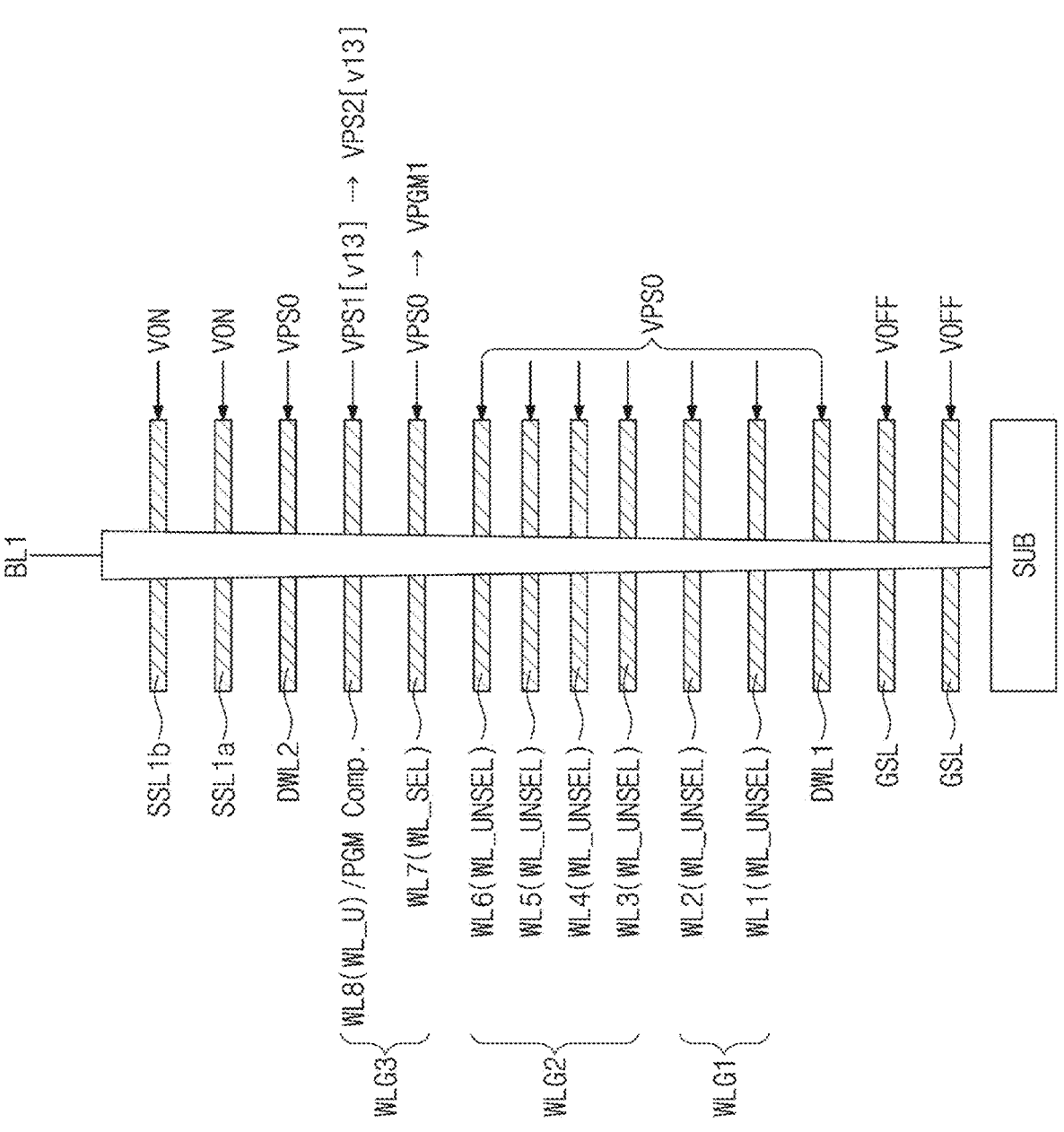

FIG. 11 is a diagram for describing a program operation for a cell string of FIG. 10. FIGS. 12A and 12B are diagrams for describing a program operation of FIG. 11 in detail. For brevity of drawing and for convenience of description, a graph of FIG. 11 shows a voltage that is applied to the upper adjacent word line WL_U. However, the present disclosure is not limited thereto. For example, voltages that are applied to the remaining lines (e.g., BL, SSL, WL_SEL, WL_UNSEL, and GSL) may be controlled to be similar to those described with reference to FIG. 7.

Referring to FIGS. 2 and 10 to 12B, in the program operation, the memory device 120 may control the pass voltage VPS to be applied to the upper adjacent word line WL_U, depending on a distance from the selected word line WL_SEL to the upper adjacent word line WL_U.

For example, when the selected word line WL_SEL is included in the second word line group WLG2, the word line space between the selected word line WL_SEL and the upper adjacent word line WL_U may be smaller than a first reference space Ls_REF1. In this case, referring to a second graph G2 of FIG. 11, the memory device 120 may apply a 12nd voltage v12 as the first pass voltage VPS1 in the word line setup period WL Setup of the program step PGM Step and may apply a list voltage v11 as the second pass voltage VPS2 in the program execution period PGM Exec. of the program step PGM Step. Herein, the 12nd voltage v12 may be greater than the 11st voltage v11.

In detail, as illustrated in FIG. 12A, the selected word line WL_SEL may be the fifth word line WL5 included in the second word line group WLG2. In this case, the sixth to eighth word lines WL6, WL7, and WL8 may be in a state of being completely programmed, and the sixth word line WL6 may be the upper adjacent word line WL_U. The memory device 120 may apply the on voltage VON to the string selection lines SSL1*a* and SSL1*b*, may apply the off voltage VOFF to the ground selection line GSL, and may apply the 0-th pass voltage VPS0 to the remaining unselected word lines WL1 to WL4, WL7, and WL8. The memory device 120 may sequentially apply the 0-th pass voltage VPS0 and the first program voltage VPGM1 to the fifth word line WL5 being the selected word line WL_SEL. In this case, as described above, the memory device 120 may apply the 12nd voltage v12 as the first pass voltage VPS1 to the sixth word line WL6 being the upper adjacent word line WL_U and may apply the list voltage v11 smaller than the 12nd voltage v12 as the second pass voltage VPS2 to the sixth word line WL6.

Returning to FIG. 11, when the selected word line WL_SEL is included in the third word line group WLG3, the space between the selected word line WL_SEL and the upper adjacent word line WL_U may be greater than the first reference space Ls_REF1 and may be smaller than a second reference space Ls_REF2. In this case, referring to a third graph G3 of FIG. 11, the memory device 120 may apply a 13rd voltage v13 as the first pass voltage VPS1 in the word line setup period WL Setup of the program step PGM Step and may apply the 13rd voltage v13 as the second pass voltage VPS2 in the program execution period PGM Exec. of the program step PGM Step.

In detail, as illustrated in FIG. 12B, the selected word line WL_SEL may be the seventh word line WL7 included in the third word line group WLG3. In this case, the eighth word line WL8 may be in a state of being completely programmed, and the eighth word line WL8 may be the upper adjacent word line WL_U. The memory device 120 may apply the on voltage VON to the string selection lines SSL1$a$ and SSL1$b$, may apply the off voltage VOFF to the ground selection line GSL, and may apply the 0-th pass voltage VPS0 to the remaining unselected word lines WL1 to WL6. The memory device 120 may sequentially apply the 0-th pass voltage VPS0 and the first program voltage VPGM1 to the seventh word line WL7 being the selected word line WL_SEL. In this case, as described above, the memory device 120 may apply the 13rd voltage v13 as the first pass voltage VPS1 to the eighth word line WL8 being the upper adjacent word line WL_U and may apply the 13rd voltage v13 as the second pass voltage VPS2 to the eighth word line WL8.

Returning to FIG. 11, when the selected word line WL_SEL is included in the first word line group WLG1, the space between the selected word line WL_SEL and the upper adjacent word line WL_U may be greater than the second reference space Ls_REF2. In this case, referring to a first graph G1 of FIG. 11, the memory device 120 may apply a 14th voltage v14 as the first pass voltage VPS1 in the word line setup period WL Setup of the program step PGM Step and may apply the 14th voltage v14 as the second pass voltage VPS2 in the program execution period PGM Exec. of the program step PGM Step. In some example embodiments in which the selected word line WL_SEL is included in the first word line group WLG1 are similar to the example embodiments of FIG. 12B except that locations of the selected word line WL_SEL are different, and thus, additional description will be omitted to avoid redundancy.

As described above, as the distance from the selected word line WL_SEL to the upper adjacent word line WL_U becomes smaller, the memory device 120 may decrease the pass voltages (e.g., VPS1 and VPS2) that are applied to the upper adjacent word line WL_U. Alternatively, when the word line space between the selected word line WL_SEL and the upper adjacent word line WL_U is smaller than a specific space (e.g., the first reference space Ls_REF1), the memory device 120 may control the pass voltages (e.g., VPS1 and VPS2), which are applied to the upper adjacent word line WL_U, based on the method described with reference to FIGS. 1 to 10 (e.g., the way to increase the pass voltages VPS1 and VPS2 as the program loop is repeatedly performed).

Figure 13:
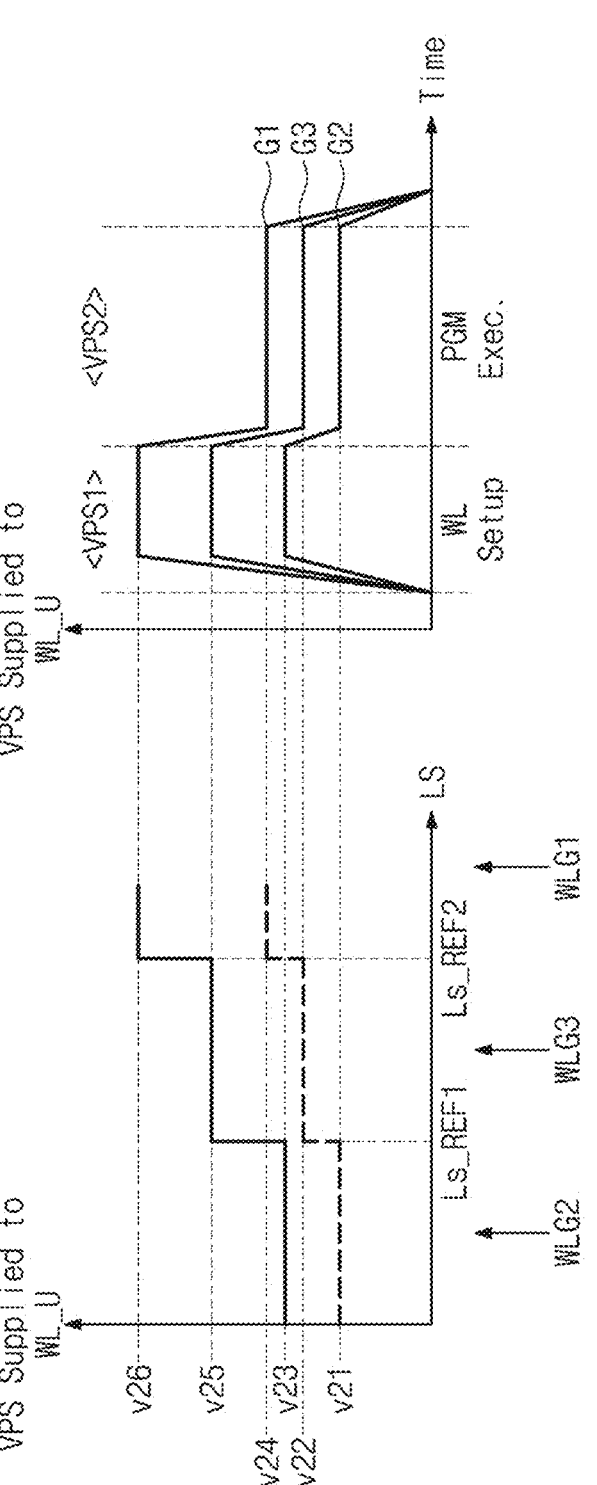
FIG. 13 is a diagram for describing a program operation for a cell string of FIG. 10.

FIG. 13 is a diagram for describing a program operation for a cell string of FIG. 10. Referring to FIGS. 2, 10, and 13, in the program operation, the memory device 120 may control the pass voltage VPS to be applied to the upper adjacent word line WL_U, depending on a distance from the selected word line WL_SEL to the upper adjacent word line WL_U.

For example, when the selected word line WL_SEL is included in the second word line group WLG2, the space between the selected word line WL_SEL and the upper adjacent word line WL_U may be smaller than the first reference space Ls_REF1. In this case, referring to a first graph G2 of FIG. 13, the memory device 120 may apply a 23rd voltage v23 as the first pass voltage VPS1 in the word line setup period WL Setup of the program step PGM Step and may apply a 21st voltage v21 as the second pass voltage VPS2 in the program execution period PGM Exec. of the program step PGM Step. In some example embodiments, the 21st voltage v21 may be smaller than the 23rd voltage v23.

Alternatively, when the selected word line WL_SEL is included in the third word line group WLG3, the space between the selected word line WL_SEL and the upper adjacent word line WL_U may be greater than the first reference space Ls_REF1 and may be smaller than the second reference space Ls_REF2. In this case, referring to a third graph G3 of FIG. 13, the memory device 120 may apply a 25th voltage v25 as the first pass voltage VPS1 in the word line setup period WL Setup of the program step PGM Step and may apply a 22nd voltage v22 as the second pass voltage VPS2 in the program execution period PGM Exec. of the program step PGM Step. In some example embodiments, the 22nd voltage v22 may be smaller than the 25th voltage v25.

Alternatively, when the selected word line WL_SEL is included in the first word line group WLG1, the space between the selected word line WL_SEL and the upper adjacent word line WL_U may be greater than the second reference space Ls_REF2. In this case, referring to a first graph G1 of FIG. 13, the memory device 120 may apply a 26th voltage v26 as the first pass voltage VPS1 in the word line setup period WL Setup of the program step PGM Step and may apply a 24th voltage v24 as the second pass voltage VPS2 in the program execution period PGM Exec. of the program step PGM Step. In some example embodiments, the 24th voltage v24 may be smaller than the 26th voltage v26.

As described above, the memory device 120 may control the pass voltages VPS1 and VPS2 of the upper adjacent word line WL_U, based on the method described with reference to FIGS. 1 to 10. In this case, the memory device 120 may control the levels of the pass voltages VPS1 and VPS2 of the upper adjacent word line WL_U depending on the distance from the selected word line WL_SEL to the upper adjacent word line WL_U. As an example, as described above, as the distance from the selected word line WL_SEL to the upper adjacent word line WL_U becomes smaller, the memory device 120 may decrease the levels of the pass voltages VPS1 and VPS2 of the upper adjacent word line WL_U.

Figure 14:
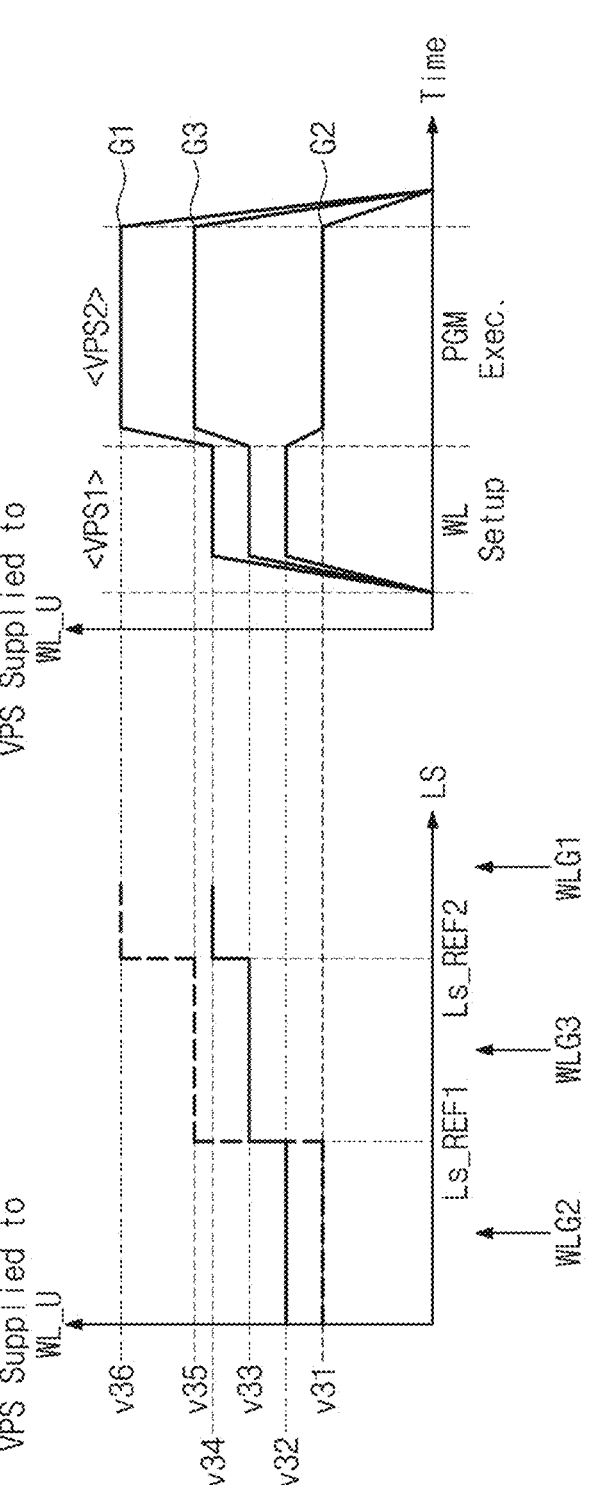
FIG. 14 is a diagram for describing a program operation for a cell string of FIG. 10.

FIG. 14 is a diagram for describing a program operation for a cell string of FIG. 10. Referring to FIGS. 2, 10, and 14, in the program operation, the memory device 120 may control the pass voltage VPS to be applied to the upper adjacent word line WL_U, depending on a distance from the selected word line WL_SEL to the upper adjacent word line WL_U.

For example, when the selected word line WL_SEL is included in the second word line group WLG2, the space between the selected word line WL_SEL and the upper adjacent word line WL_U may be smaller than the first reference space Ls_REF1. In this case, referring to a second graph G2 of FIG. 14, the memory device 120 may apply a 32nd voltage v32 as the first pass voltage VPS1 in the word line setup period WL Setup of the program step PGM Step and may apply a 31st voltage v31 as the second pass voltage VPS2 in the program execution period PGM Exec. of the program step PGM Step. In some example embodiments, the 31st voltage v31 may be smaller than the 32nd voltage v32.

Alternatively, when the selected word line WL_SEL is included in the third word line group WLG3, the space between the selected word line WL_SEL and the upper adjacent word line WL_U may be greater than the first reference space Ls_REF1 and may be smaller than the second reference space Ls_REF2. In this case, referring to a third graph G3 of FIG. 14, the memory device 120 may apply a 33rd voltage v33 as the first pass voltage VPS1 in the word line setup period WL Setup of the program step PGM Step and may apply a 35th voltage v35 as the second pass voltage VPS2 in the program execution period PGM Exec. of the program step PGM Step. In some example embodiments, the 35th voltage v35 may be greater than the 33rd voltage v33.

Alternatively, when the selected word line WL_SEL is included in the first word line group WLG1, the space between the selected word line WL_SEL and the upper adjacent word line WL_U may be greater than the second reference space Ls_REF2. In this case, referring to a first graph G1 of FIG. 14, the memory device 120 may apply a 34th voltage v34 as the first pass voltage VPS1 in the word line setup period WL Setup of the program step PGM Step and may apply a 36th voltage v36 as the second pass voltage VPS2 in the program execution period PGM Exec. of the program step PGM Step. In some example embodiments, the 36th voltage v36 may be greater than the 34th voltage v34.

As described above, the memory device 120 may control the levels of the pass voltages VPS1 and VPS2 of the upper adjacent word line WL_U depending on the distance from the selected word line WL_SEL to the upper adjacent word line WL_U. As an example, as described above, as the distance from the selected word line WL_SEL to the upper adjacent word line WL_U becomes smaller, the memory device 120 may decrease the levels of the pass voltages VPS1 and VPS2 of the upper adjacent word line WL_U. As an example, when the space between the selected word line WL_SEL and the upper adjacent word line WL_U is smaller than a specific space (e.g., Ls_REF1), the memory device 120 may control the upper adjacent word line WL_U based on the method described with reference to FIGS. 1 to 10 (e.g., VPS2 being smaller than VPS1).

In contrast, when the space between the selected word line WL_SEL and the upper adjacent word line WL_U is greater than the specific space (e.g., Ls_REF1), in the program execution period PGM Exec., the memory device 120 may apply the second pass voltage VPS2 greater than the first pass voltage VPS1 to the upper adjacent word line WL_U. According to the above description, when the word line space is relatively wide, even though the second pass voltage VPS2 is high, the influence of the program disturb due to the coupling between word lines may decrease. As such, a time taken to set up the program voltage VPGM applied to the selected word line WL_SEL may be shortened by applying the second pass voltage VPS2 whose level is relatively high.

Figure 15:
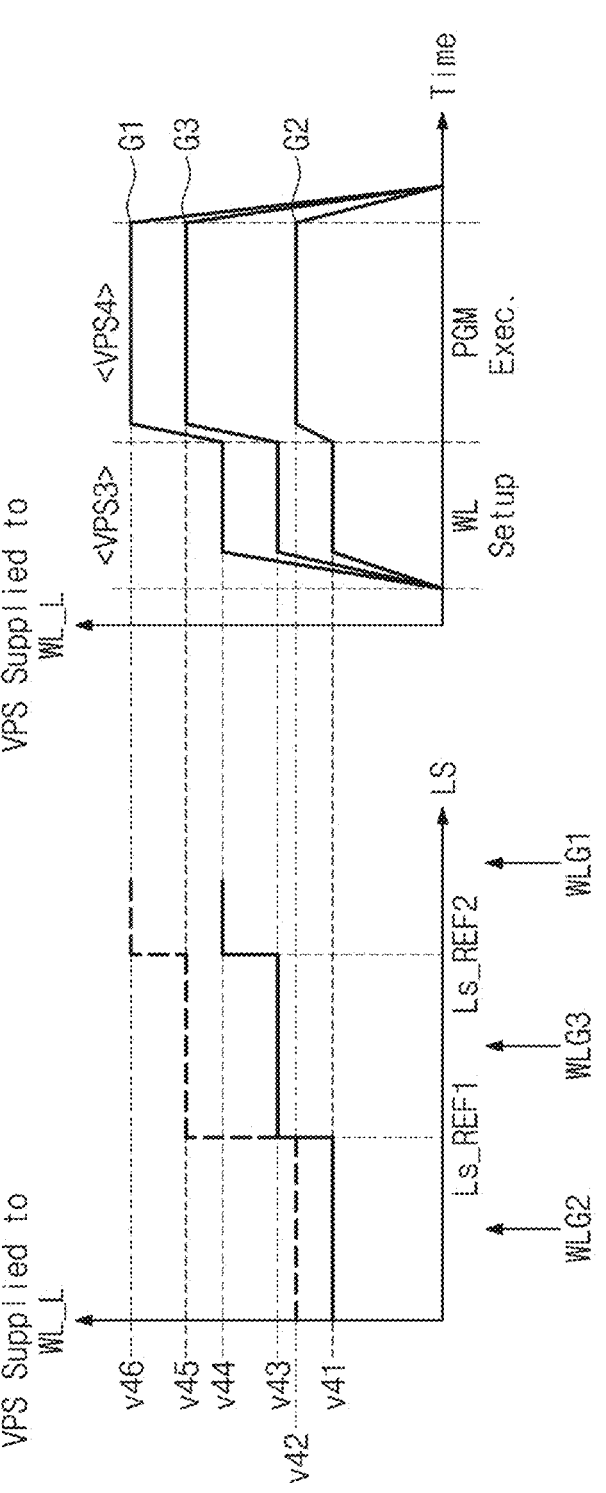
FIG. 15 is a diagram for describing a program operation for a cell string of FIG. 10.

FIG. 15 is a diagram for describing a program operation for a cell string of FIG. 10. In some example embodiments, a graph of FIG. 15 shows how to control voltages of word lines, which are connected with memory cells being not programmed, from among unselected word lines adjacent to the selected word line WL_SEL.

For example, in the structure of the cell string CS11 of FIG. 10, it is assumed that the memory device 120 performs the program operation in the order from an upper word line (e.g., WL8) to a lower word line (e.g., WL1) and the fifth word line WL5 is the selected word line WL_SEL. In this case, memory cells connected with the sixth to eighth word lines WL6 to WL8 may be in a state of being programmed, and memory cells connected with the first to fourth word lines WL1 to WL4 may be in a state of being not programmed.

In this case, the fourth and sixth word lines WL4 and WL6 may be adjacent word lines based on the fifth word line WL5 being the selected word line WL_SEL. How to control the voltage of the upper adjacent word line (e.g., WL6) being in a program-completed state from among adjacent word lines is described in the above embodiments. However, the present disclosure is not limited thereto. For example, the memory device 120 may control a voltage of a lower adjacent word line (e.g., WL4) being not programmed from among adjacent word lines.

In detail, referring to FIGS. 2, 10, and 15, in the program operation, the memory device 120 may control the voltage of the lower adjacent word line WL_L depending on a distance from the selected word line WL_SEL to the lower adjacent word line WL_L.

For example, when the selected word line WL_SEL is included in the second word line group WLG2, the space between the selected word line WL_SEL and the lower adjacent word line WL_L may be smaller than the first reference space Ls_REF1. In this case, referring to a second graph G2 of FIG. 15, the memory device 120 may apply a 41st voltage v41 as a third pass voltage VPS3 in the word line setup period WL Setup of the program step PGM Step and may apply a 42nd voltage v42 as a fourth pass voltage VPS4 in the program execution period PGM Exec. of the program step PGM Step. In some example embodiments, the 42nd voltage v42 may be greater than the 41st voltage v41.

Alternatively, when the selected word line WL_SEL is included in the third word line group WLG3, the space between the selected word line WL_SEL and the lower adjacent word line WL_L may be greater than the first reference space Ls_REF1 and may be smaller than the second reference space Ls_REF2. In this case, referring to a third graph G3 of FIG. 15, the memory device 120 may apply a 43rd voltage v43 as the third pass voltage VPS3 in the word line setup period WL Setup of the program step PGM Step and may apply a 45th voltage v45 as the fourth pass voltage VPS4 in the program execution period PGM Exec. of the program step PGM Step. In some example embodiments, the 45th voltage v45 may be greater than the 43rd voltage v43.

Alternatively, when the selected word line WL_SEL is included in the first word line group WLG1, the space between the selected word line WL_SEL and the lower adjacent word line WL_L may be greater than the second reference space Ls_REF2. In this case, referring to a first graph G1 of FIG. 15, the memory device 120 may apply a 44th voltage v44 as the third pass voltage VPS3 in the word line setup period WL Setup of the program step PGM Step and may apply a 46th voltage v46 as the fourth pass voltage VPS4 in the program execution period PGM Exec. of the program step PGM Step. In some example embodiments, the 46th voltage v46 may be greater than the 44th voltage v44.

In some example embodiments, voltages of the remaining lines (e.g., the selected word line WL_SEL, the unselected word lines WL_UNSEL, and the upper adjacent word line WL_U) may be controlled based on the method described with reference to FIGS. 1 to 14.

As described above, the memory device 120 may control the voltage of the lower adjacent word line WL_L among unselected word lines. In this case, the memory device 120 may set the fourth pass voltage VPS4 applied to the lower adjacent word line WL_L in the program execution period PGM Exec. to be higher than the third pass voltage VPS3 applied to the lower adjacent word line WL_L in the word line setup period WL Setup. In this case, a time taken to set up the program voltage VPGM provided to the selected word line WL_SEL in the program execution period PGM Exec. may decrease, and thus, the total program time may be shortened. In addition, because the lower adjacent word line WL_L is connected with memory cells being not yet programmed, even though the fourth pass voltage VPS4 is greater than the third pass voltage VPS3, the program disturb may not occur or be reduced.

Figure 16:
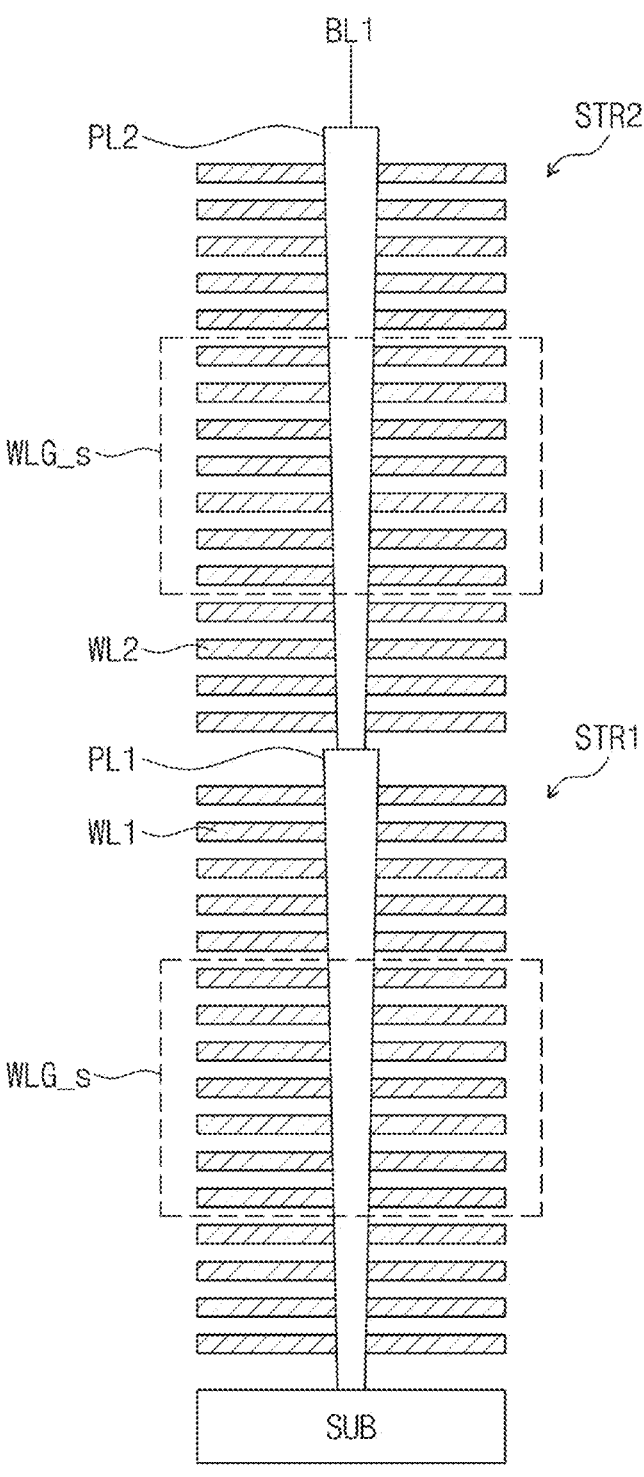
FIG. 16 is a diagram illustrating a stacked structure of a memory block according to some example embodiments of the present disclosure.

FIG. 16 is a diagram illustrating a stacked structure of a memory block according to some example embodiments of the present disclosure. For convenience of description, additional description associated with the components described above will be omitted to avoid redundancy. Referring to FIG. 16, the memory block BLK may have a multi-stack structure.

For example, the memory block BLK may include a first memory structure STR1 formed on the substrate SUB and a second memory structure STR2 formed on the first memory structure STR1. The first memory structure STR1 may include a plurality of first word lines WL1 vertically stacked on the substrate SUB and a first pillar PL1 formed to vertically penetrate the plurality of first word lines WL1.

The second memory structure STR2 may include a plurality of second word lines WL2 vertically stacked on the first memory structure STR1 and a second pillar PL2 formed to vertically penetrate the plurality of second word lines WL2. In some example embodiments, the first pillar PL1 and the second pillar PL2 may be electrically connected to form one channel. The channel thus formed may be electrically connected with the first bit line BL1.

In some example embodiments, each of the first word lines WL1 and the second word lines WL2 may be spaced from a word line adjacent thereto by a word line space that varies depending on a location thereof. For example, as illustrated in FIG. 16, word lines (e.g., some of the first word lines WL1 and some of the second word lines WL2) included in a specific word line group WLG_s may be spaced from each other by a relatively small word line space, compared to the remaining word lines. In this case, when the selected word line WL_SEL is included in the specific word line group WLG_s (e.g., when the selected word line WL_SEL is spaced from a word line adjacent thereto by a relatively small word line space), the memory device 120 may operate based on the method described with reference to FIGS. 1 to 15.

Figure 17:
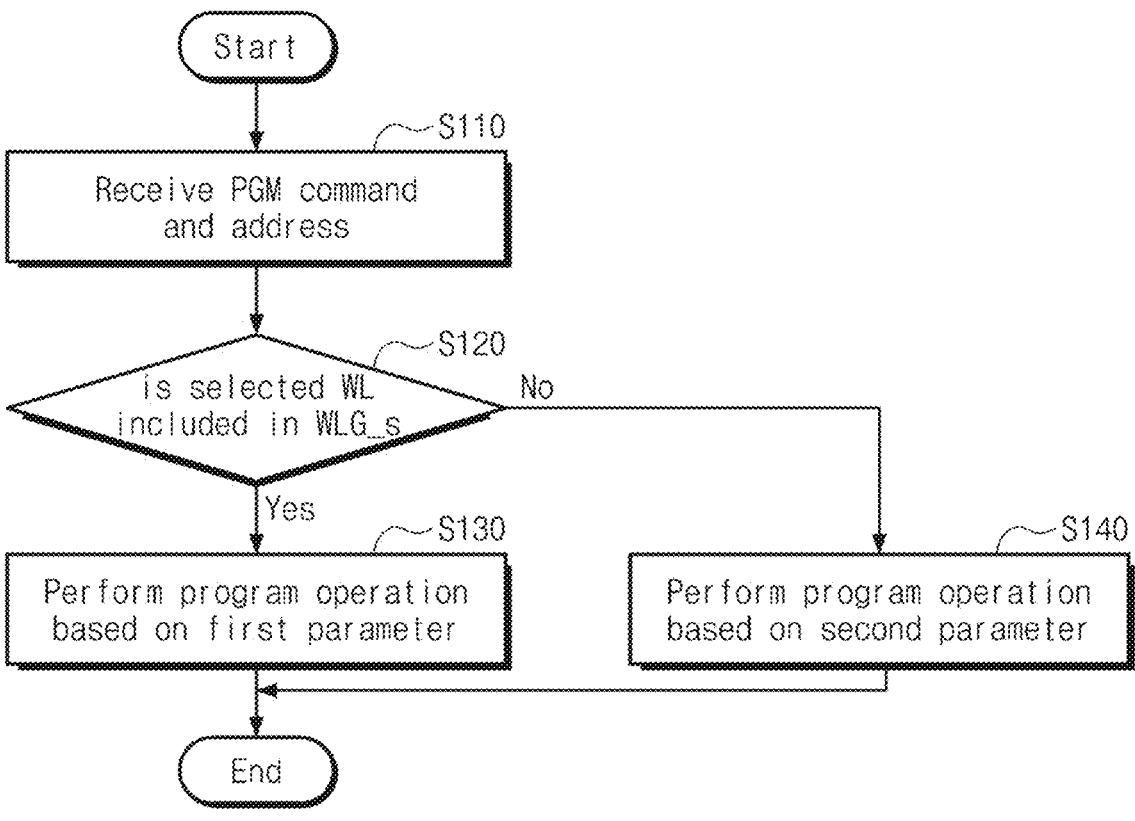
FIG. 17 is a flowchart illustrating a program operation of a memory device of FIG. 2.

FIG. 17 is a flowchart illustrating a program operation of a memory device of FIG. 2. Referring to FIGS. 1, 2, and 17, the memory device 120 may receive a program command and an address from the memory controller 110.

In operation S110, the memory device 120 may receive a program command PGM and an address from the memory controller 110.

In operation S120, the memory device 120 may determine whether a word line (e.g., a selected word line) corresponding to the received address is included in the specific word line group WLG_s. For example, the specific word line group WLG_s may include a word line whose word line space is smaller than a reference space. That is, that the selected word line is included in the specific word line group WLG_s may mean that the distance Ls from the selected word line WL_SEL to an adjacent word line (e.g., the upper adjacent word line WL_U or the lower adjacent word line WL_L) adjacent thereto is smaller than the reference space.

When the selected word line WL_SEL is included in the specific word line group WLG_s, in operation S130, the memory device 120 may perform the program operation based on a first parameter. For example, the memory device 120 may perform the program operation based on the operation method for the first word line group WLG1 described with reference to FIGS. 10 to 16. In detail, the memory device 120 may apply the first pass voltage VPS1 to the upper adjacent word line WL_U in the word line setup period WL Setup and may apply the second pass voltage VPS2 smaller than the first pass voltage VPS1 to the upper adjacent word line WL_U in the program execution period PGM Exec.

In some example embodiments, the memory device 120 may be further configured to control the first pass voltage VPS1 or the second pass voltage VPS2 as the program loops are performed, as described with reference to FIGS. 9A to 9C.

When the selected word line WL_SEL is not included in the specific word line group WLG_s, in operation S140, the memory device 120 may perform the program operation based on a second parameter. For example, the memory device 120 may perform the program operation based on the operation method for the second word line group WLG2 or the third word line group WLG3 described with reference to FIGS. 10 to 16. In detail, the memory device 120 may apply the first pass voltage VPS1 to the upper adjacent word line WL_U in the word line setup period WL Setup and may apply the second pass voltage VPS2 having the same level as the first pass voltage VPS1 to the upper adjacent word line WL_U in the program execution period PGM Exec. Alternatively, the memory device 120 may apply the first pass voltage VPS1 to the upper adjacent word line WL_U in the word line setup period WL Setup and may apply the second pass voltage VPS2 greater than the first pass voltage VPS1 to the upper adjacent word line WL_U in the program execution period PGM Exec. Alternatively, the memory device 120 may apply the first pass voltage VPS1 to the upper adjacent word line WL_U in the word line setup period WL Setup and may apply the second pass voltage VPS2 lower in level than the first pass voltage VPS1 to the upper adjacent word line WL_U in the program execution period PGM Exec. In this case, the first pass voltage VPS1 based on the second parameter may be greater than the first pass voltage VPS1 based on the first parameter, and the second pass voltage VPS2 based on the second parameter may be greater than the second pass voltage VPS2 based on the first parameter.

As described above, according to some example embodiments of the present disclosure, in the program operation for the selected word line WL_SEL, the memory device 120 may apply the first pass voltage VPS1 to the upper adjacent word line WL_U (e.g., a word line being completely programmed from among word lines adjacent to the selected word line WL_SEL) in the word line setup period WL Setup and may apply the second pass voltage VPS2 smaller than the first pass voltage VPS1 to the upper adjacent word line WL_U in the program execution period PGM Exec. In this case, the channel boosting efficiency for cell strings including unselected cell strings or program-inhibited memory cells may be improved, and as the word line coupling decreases, the program disturb may decrease or may be prevented.

Figure 18:
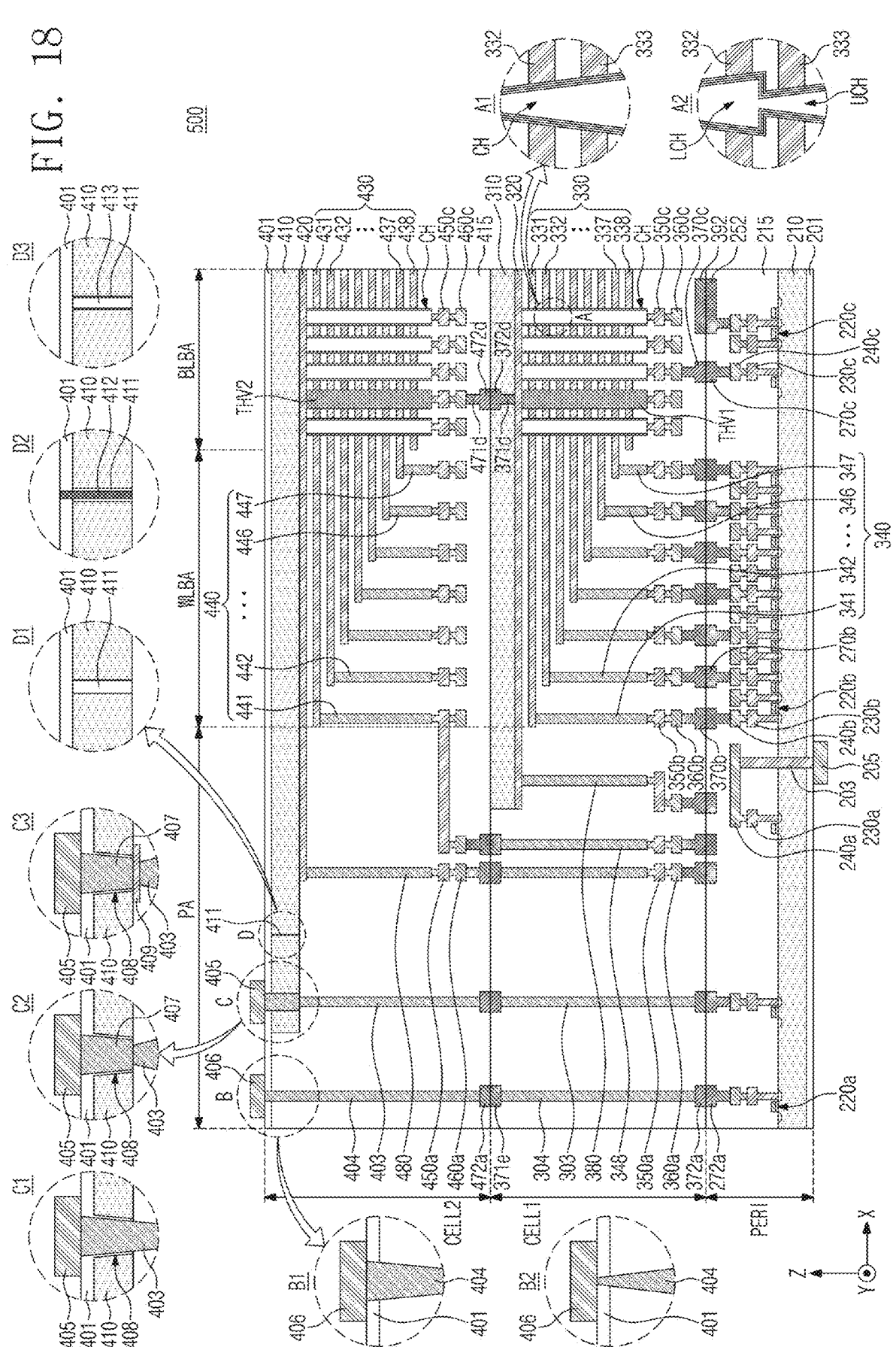
FIG. 18 is a view for describing a memory device according to some example embodiments of the present disclosure.

FIG. 18 is a view illustrating a memory device 500 according to some example embodiments of the inventive concepts.

Referring to FIG. 18, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) and/or tungsten (W).

The memory device 500 may include the at least one upper chip including the cell region. For example, as illustrated in FIG. 18, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 18. However, example embodiments of the inventive concepts are not limited thereto. In some example embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in some example embodiments. However, example embodiments of the inventive concepts are not limited thereto. In some example embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (e.g., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (e.g., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some example embodiments, as illustrated in a region 'A', the channel structure CH may be provided in the bit line bonding region BLBA and may extend in the direction perpendicular to the top surface of the second substrate 310 to penetrate the word lines 330, the string selection lines, and the ground selection line.

In some example embodiments, as illustrated in a region 'A1', the channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to some example embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, example embodiments of the inventive concepts are not limited thereto. In some example embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 18, the first through-electrode THV1 may penetrate the common source line 320 and the plurality of word lines 330. In some example embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

Referring again to FIG. 18, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some example embodiments, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, and/or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. Referring to FIG. 18, a lower insulating layer 201 may cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some example embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some example embodiments, as illustrated in a region 131', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some example embodiments, as illustrated in a region 132', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some example embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some example embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, example embodiments of the inventive concepts are not limited thereto, and in some example embodiments, the diameter of the second input/output contact plug 403 may become progressively less toward the second input/output pad 405.

In some example embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some example embodiments illustrated in a region 'C3', a stopper 409 may further be formed on a bottom end of the opening 408 of the third substrate 410, as compared with the example embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some example embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some example embodiments, as illustrated in a region 'D1', the slit 411 may be formed to penetrate the third substrate 410. For example, the slit 411 may be used to prevent or reduce a likelihood of the third substrate 410 being finely cracked when the opening 408 is formed. However, example embodiments of the inventive concepts are not limited thereto, and in some example embodiments, the slit 411 may be formed to have a depth ranging from exactly or about 60% to exactly or about 70% of a thickness of the third substrate 410.

In some example embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some example embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent or reduce a voltage provided through the second input/output pad 405 from affecting a metal layer disposed on the third substrate 410 in the word line bonding region WLBA. Meanwhile, in some example embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some example embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

In some example embodiments, the memory device 500 illustrated in FIG. 18 may operate based on the program method described with reference to FIGS. 1 to 17. For example, the memory device 500 may sequentially apply a first pass voltage and a second pass voltage smaller than the first pass voltage to an unselected word line adjacent to a selected word line in a program step of a program operation.

Figure 19:
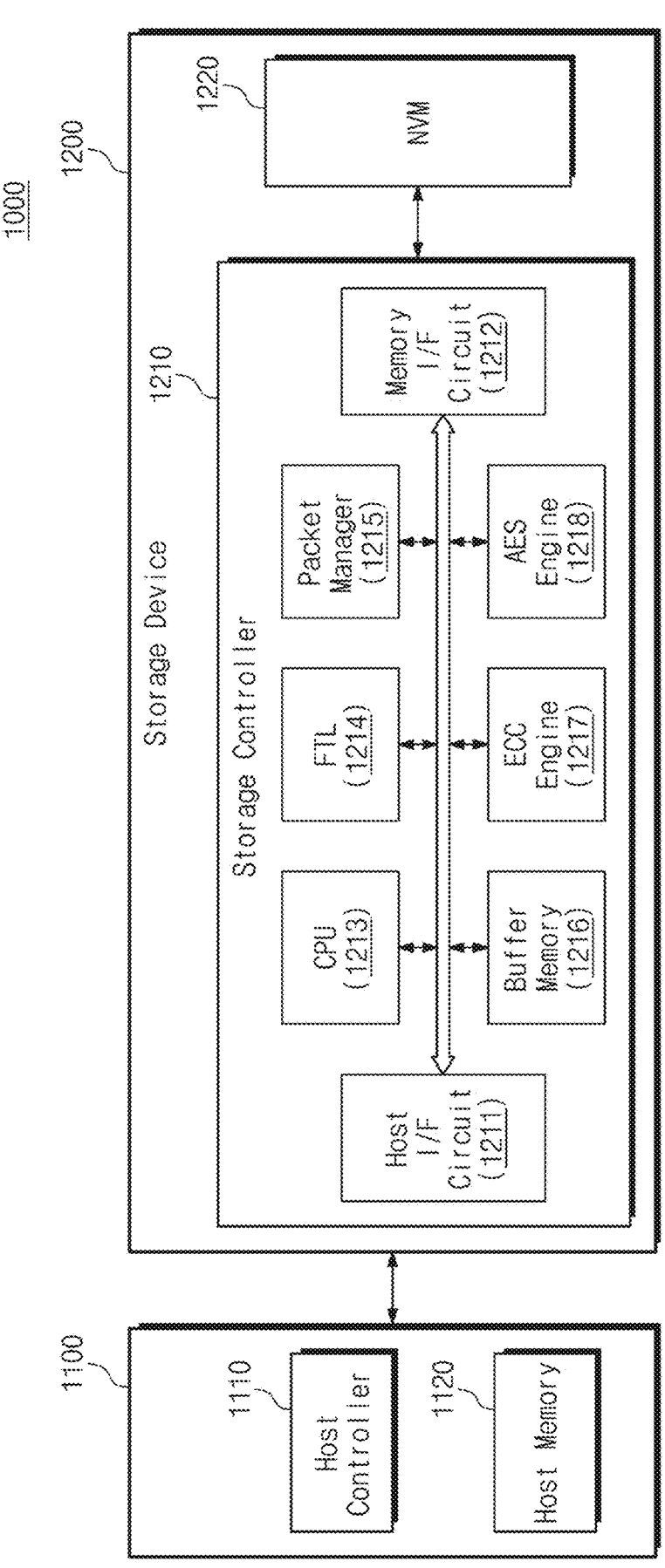
FIG. 19 is a block diagram illustrating a host-storage system according to some example embodiments of the present disclosure.

FIG. 19 is a block diagram of a host storage system 1000 according to some example embodiments.

The host storage system 1000 may include a host 1100 and a storage device 1200. Further, the storage device 1200 may include a storage controller 1210 and an NVM 220. According to some example embodiments, the host 1100 may include a host controller 1110 and a host memory 1120. The host memory 1120 may serve as a buffer memory configured to temporarily store data to be transmitted to the storage device 1200 or data received from the storage device 1200.

The storage device 1200 may include storage media configured to store data in response to requests from the host 1100. As an example, the storage device 1200 may include at least one of an SSD, an embedded memory, and a removable external memory. When the storage device 1200 is an SSD, the storage device 1200 may be a device that conforms to an NVMe standard. When the storage device 1200 is an embedded memory or an external memory, the storage device 1200 may be a device that conforms to a UFS standard or an eMMC standard. Each of the host 1100 and the storage device 1200 may generate a packet according to an adopted standard protocol and transmit the packet.

When the nonvolatile memory device (NVM) 1220 of the storage device 1200 includes a flash memory, the flash memory may include a 2D NAND memory array or a 3D (or vertical) NAND (VNAND) memory array. As another example, the storage device 1200 may include various other kinds of NVMs. For example, the storage device 1200 may include magnetic RAM (MRAM), spin-transfer torque MRAM, conductive bridging RAM (CBRAM), ferroelectric RAM (FRAM), PRAM, RRAM, and various other kinds of memories.

According to some example embodiments, the host controller 1110 and the host memory 1120 may be implemented as separate semiconductor chips, or the host control 1110 and host memory 1120 may be implemented as a plurality of semiconductor chips. Alternatively, in some example embodiments, the host controller 1110 and the host memory 1120 may be integrated in the same semiconductor chip. As an example, the host controller 1110 may be any one of a plurality of modules included in an application processor (AP). The AP may be implemented as a System on Chip (SoC). Further, the host memory 1120 may be an embedded memory included in the AP or an NVM or memory module located outside the AP.

The host controller 1110 may manage an operation of storing data (e.g., write data) of a buffer region of the host memory 1120 in the NVM 1220 or an operation of storing data (e.g., read data) of the NVM 1220 in the buffer region.

The storage controller 1210 may include a host interface 1211, a memory interface 1212, and a CPU 1213. Further, the storage controllers 1210 may further include a flash translation layer (FTL) 1214, a packet manager 1215, a buffer memory 1216, an error correction code (ECC) engine 1217, and an advanced encryption standard (AES) engine 1218. The storage controllers 1210 may further include a working memory (not shown) in which the FTL 1214 is loaded. The CPU 1213 may execute the FTL 1214 to control data write and read operations on the NVM 1220.

The host interface 1211 may transmit and receive packets to and from the host 1100. A packet transmitted from the host 1100 to the host interface 1211 may include a command or data to be written to the NVM 1220. A packet transmitted from the host interface 1211 to the host 1100 may include a response to the command or data read from the NVM 1220. The memory interface 1212 may transmit data to be written to the NVM 1220 to the NVM 1220 or receive data read from the NVM 1220. The memory interface 1212 may be configured to comply with a standard protocol, such as Toggle or open NAND flash interface (ONFI).

The FTL 1214 may perform various functions, such as an address mapping operation, a wear-leveling operation, and a garbage collection operation. The address mapping operation may be an operation of converting a logical address received from the host 1100 into a physical address used to actually store data in the NVM 1220. The wear-leveling operation may be a technique for preventing or reducing excessive deterioration of a specific block by allowing blocks of the NVM 1220 to be uniformly used. As an example, the wear-leveling operation may be implemented using a firmware technique that balances erase counts of physical blocks. The garbage collection operation may be a technique for ensuring usable capacity in the NVM 1220 by erasing an existing block after copying valid data of the existing block to a new block.

The packet manager 1215 may generate a packet according to a protocol of an interface, which consents to the host 1100, or parse various types of information from the packet received from the host 1100. In addition, the buffer memory 1216 may temporarily store data to be written to the NVM 1220 or data to be read from the NVM 1220. Although the buffer memory 1216 may be a component included in the storage controllers 1210, the buffer memory 1216 may be outside the storage controllers 1210.

The ECC engine 1217 may perform error detection and correction operations on read data read from the NVM 1220. More specifically, the ECC engine 1217 may generate parity bits for write data to be written to the NVM 1220, and the generated parity bits may be stored in the NVM 1220 together with write data. During the reading of data from the NVM 1220, the ECC engine 1217 may correct an error in the read data by using the parity bits read from the NVM 1220 along with the read data, and output error-corrected read data.

The AES engine 1218 may perform at least one of an encryption operation and a decryption operation on data input to the storage controllers 1210 by using a symmetric-key algorithm.

In some example embodiments, the NVM 1220 of the storage device 1200 may be the memory device described with reference to FIGS. 1 to 18 or may operate based on the operation method described with reference to FIGS. 1 to 18.

According to the present disclosure, operation methods of memory devices with improved reliability and improved performance are provided.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The memory system 100 (or other circuitry, for example, memory control 110, controller interface circuitry 111, memory device 120, memory interface circuitry 121, control logic circuitry 122, memory cell array 123, address decoder 124, page buffer 125, host storage system 1000, and subcomponents thereof) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. An operation method of a memory device which includes a plurality of memory cells stacked in a direction perpendicular to a substrate and a plurality of word lines respectively connected with the plurality of memory cells, the method comprising:

during a first word line setup period, applying a 0-th pass voltage to a first selected word line among the plurality of word lines, applying a first pass voltage to a first upper adjacent word line among the plurality of word lines, the 0-th pass voltage and the first pass voltage being different voltages, and applying the 0-th pass voltage to remaining unselected word lines of the plurality of word lines other than the first selected word line and the first upper adjacent word line; and during a first program execution period after the first word line setup period, applying a first program voltage to the first selected word line, and applying a second pass voltage smaller than the first pass voltage to the first upper adjacent word line, and applying the 0-th pass voltage to the remaining unselected word lines of the plurality of word lines other than the first selected word line and the first upper adjacent word line, wherein the first upper adjacent word line is a word line physically adjacent to the first selected word line, and wherein each of the 0-th, first, and second pass voltages has a level to turn on the plurality of memory cells.

2. The method of claim 1, wherein the first pass voltage is greater than the 0-th pass voltage.

3. The method of claim 1, wherein the first upper adjacent word line is a word line connected with memory cells being completely programmed from among word lines adjacent to the first selected word line.

4. The method of claim 1, wherein the first upper adjacent word line is a highest word line from the substrate from among word lines adjacent to the first selected word line.

5. The method of claim 1, further comprising:

after the first program execution period, applying at least one of a plurality of program verification voltages to the first selected word line.

6. The method of claim 1, further comprising:

during a second word line setup period, applying the 0-th pass voltage to a second selected word line among the plurality of word lines and applying a third pass voltage to a second upper adjacent word line among the plurality of word lines; and during a second program execution period after the second word line setup period, applying a second program voltage to the second selected word line and applying a fourth pass voltage to the second upper adjacent word line, wherein a first distance from the first selected word line to the first upper adjacent word line is smaller than a second distance from the second selected word line to the second upper adjacent word line, and wherein the third pass voltage is greater than the first pass voltage and the fourth pass voltage is greater than the second pass voltage.

7. The method of claim 6, wherein the third pass voltage is greater than the fourth pass voltage.

8. The method of claim 6, wherein the third pass voltage is identical to the fourth pass voltage.

9. The method of claim 6, wherein the third pass voltage is smaller than the fourth pass voltage.

10. The method of claim 1, further comprising:

during the first program execution period, applying a fourth pass voltage to a first lower adjacent word line among the plurality of word lines, wherein the first lower adjacent word line is a word line physically adjacent to the first selected word line.

11. The method of claim 10, wherein the first lower adjacent word line is a word line connected with memory cells being not completely programmed from among word lines physically adjacent to the first selected word line.

12. The method of claim 10, wherein the first lower adjacent word line is a closest word line to the substrate from among word lines physically adjacent to the first selected word line.

13. An operation method of a memory device which includes a plurality of memory cells stacked in a direction perpendicular to a substrate and a plurality of word lines respectively connected with the plurality of memory cells, the method comprising:

in a first word line setup period of a first program loop, applying a 0-th pass voltage to a first selected word line among the plurality of word lines, applying a first pass voltage to a first upper adjacent word line adjacent to the first selected word line from among the plurality of word lines, the 0-th pass voltage and the first pass voltage being different voltages, and applying the 0-th pass voltage to remaining unselected word lines of the plurality of word lines other than the first selected word line and the first upper adjacent word line;

in a first program execution period of the first program loop after the first word line setup period, applying a first program voltage to the first selected word line, and applying a second pass voltage smaller than the first pass voltage to the first upper adjacent word line, and applying the 0-th pass voltage to the remaining unselected word lines of the plurality of word lines other than the first selected word line and the first upper adjacent word line;

in a second word line setup period of a second program loop, applying the 0-th pass voltage to the first selected word line and applying a third pass voltage to the first upper adjacent word line; and in a second program execution period of the second program loop after the second word line setup period, applying a second program voltage greater than the first program voltage to the first selected word line and applying a fourth pass voltage to the first upper adjacent word line, and wherein each of the 0-th, first and second pass voltages has a level to turn on the plurality of memory cells.

14. The method of claim 13, wherein the third pass voltage is greater than the first pass voltage or the fourth pass voltage is greater than the second pass voltage.

15. The method of claim 13, wherein the first upper adjacent word line is a word line connected with memory cells being completely programmed from among word lines adjacent to the first selected word line.

16. The method of claim 13, wherein a first space between the first upper adjacent word line and the first selected word line is narrower than a first reference space.

17. The method of claim 13, further comprising:

after the first program execution period and before the second word line setup period, applying at least one of a plurality of program verification voltages to the first selected word line; and after the second program execution period, applying at least one of the plurality of program verification voltages to the first selected word line.

18. An operation method of a memory device which includes a plurality of memory cells stacked in a direction perpendicular to a substrate and a plurality of word lines respectively connected with the plurality of memory cells, the method comprising:

performing a first program operation on a first selected word line among of the plurality of word lines; and performing a second program operation on a second selected word line different from the first selected word line from among of the plurality of word lines, wherein the first program operation includes:

applying, in a first word line setup period, a 0-th pass voltage to the first selected word line and applying a first pass voltage to a first upper adjacent word line; and applying, in a first program execution period after the first word line setup period, a first program voltage to the first selected word line and applying a second pass voltage smaller than the first pass voltage to the first upper adjacent word line, the second program operation includes:

applying, in a second word line setup period, the 0-th pass voltage to the second selected word line and applying a third pass voltage greater than the first pass voltage to a second upper adjacent word line; and applying, in a second program execution period after the second word line setup period, the first program voltage to the second selected word line and applying a fourth pass voltage greater than the second pass voltage to the second upper adjacent word line, a first distance from the first selected word line to the first upper adjacent word line is smaller than a second distance from the second selected word line to the second upper adjacent word line.

19. The method of claim 18, wherein the first upper adjacent word line is a word line, which is connected with the plurality of memory cells being completely programmed at a point in time of the first program operation, from among word lines adjacent to the first selected word line, and wherein the second upper adjacent word line is a word line, which is connected with the plurality of memory cells being completely programmed at a point in time of the second program operation, from among word lines adjacent to the second selected word line.

* * * * *